US006586670B2

(12) United States Patent
Yoshikawa

(10) Patent No.: US 6,586,670 B2
(45) Date of Patent: Jul. 1, 2003

(54) PHOTOELECTRIC CONVERSION DEVICE AND METHOD FOR PRODUCING SAME

(75) Inventor: Masaru Yoshikawa, Kanagawa-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/928,989

(22) Filed: Aug. 15, 2001

(65) Prior Publication Data

US 2002/0040728 A1 Apr. 11, 2002

(30) Foreign Application Priority Data

Aug. 15, 2000 (JP) ........................................ 2000-246510
Jan. 24, 2001 (JP) ........................................ 2001-016378
Mar. 9, 2001 (JP) ........................................ 2001-067701

(51) Int. Cl.$^7$ .......................... H01L 31/04; H01M 14/00

(52) U.S. Cl. ......................... 136/263; 136/256; 136/252; 136/250; 429/111; 438/85; 438/63; 438/82

(58) Field of Search ................................ 136/263, 256, 136/252, 250; 429/111; 438/85, 63, 82

(56) References Cited

U.S. PATENT DOCUMENTS 5,885,368 A * 3/1999 Lupo et al. ................. 136/263
6,084,176 A * 7/2000 Shiratsuchi et al. ........ 136/263
6,150,605 A * 11/2000 Han .......................... 136/263
6,291,763 B1 * 9/2001 Nakamuar .................. 136/256
6,300,559 B1 * 10/2001 Ohmori ...................... 136/263
6,335,481 B1 * 1/2002 Watanabe ................... 136/263
6,350,946 B1 * 2/2002 Miyake et al. .............. 136/263
6,376,765 B1 * 4/2002 Wariishi et al. ............. 136/263

OTHER PUBLICATIONS

Sato et al, "Light–harvesting effect in photoelectric conversion with dye multilayers on a semiconductor electrode," J. Phys. Chem., vol. 92, pp. 754–759, (1988).*
Chemical Abstract No. 109:131981n, Oct. 1988.*
Chemical Abstract No. 114:90581q, Mar. 1991.*

* cited by examiner

*Primary Examiner*—Alan Diamond

(57) ABSTRACT

A method for producing a photoelectric conversion device comprising a conductive support and a photosensitive layer containing a semiconductor fine particle on which a dye is adsorbed, wherein the semiconductor fine particle is treated with a compound represented by the following general formula (I):

(I)

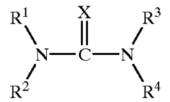

wherein X represents an oxygen atom, a sulfur atom, a selenium atom or NY, in which Y represents a hydrogen atom, an aliphatic hydrocarbon group, a hydroxyl group or an alkoxy group; $R^1$, $R^2$, $R^3$ and $R^4$ independently represent a hydrogen atom, an aliphatic hydrocarbon group, an aryl group, a heterocyclic group, —N($R^5$)($R^6$), —C(=O)$R^7$, —C(=S)$R^8$, —$SO_2R^9$ or —$OR^{10}$; $R^5$ and $R^6$ independently have the same meaning as the $R^1$, $R^2$, $R^3$ and $R^4$; $R^7$, $R^8$ and $R^9$ independently represent a hydrogen atom, an aliphatic hydrocarbon group, an aryl group, a heterocyclic group, —N($R^5$)($R^6$), —$OR^{10}$ or —$SR^{11}$; and $R^{10}$ and $R^{11}$ independently represent a hydrogen atom or an aliphatic hydrocarbon group.

19 Claims, 5 Drawing Sheets

PHOTOELECTRIC CONVERSION DEVICE AND METHOD FOR PRODUCING SAME

BACKGROUND OF THE INVENTION

The present invention relates to a method for producing a photoelectric conversion device comprising a semiconductor fine particle sensitized by a dye, a photoelectric conversion device produced by the method and a photoelectric cell comprising the photoelectric conversion device.

Photoelectric conversion devices have been used for optical sensors, copying machines, photovoltaics, etc. Such photoelectric conversion devices that use a metal, a semiconductor, an organic pigment, a dye, a combination thereof, etc. have been made practicable.

Photoelectric conversion devices using a semiconductor fine particle sensitized by a dye, hereinafter referred to as "dye-sensitized photoelectric conversion device," and materials and producing methods therefor have been disclosed in U.S. Pat. Nos. 4,927,721, 4,684,537, 5,084,365, 5,350,644, 5,463,057, 5,525,440, WO 98/50393, Japanese Patent Laid-Open No. 7-249790 and Japanese Patent Publication No. 10-504521. The dye-sensitized photoelectric conversion devices can be produced at reduced costs because an inexpensive metal oxide semiconductor such as titanium dioxide can be used therefor without purification to a high purity. However, the conventional, dye-sensitized photoelectric conversion devices do not necessarily have sufficiently high photoelectric conversion efficiency. It is thus highly desired to develop a dye-sensitized photoelectric conversion device exhibiting improved photoelectric conversion efficiency.

OBJECT AND SUMMARY OF THE INVENTION

An object of the present invention is to provide a method for producing a dye-sensitized photoelectric conversion device excellent in photoelectric conversion efficiency, a photoelectric conversion device produced thereby and a photoelectric cell comprising the device.

As a result of intense research in view of the above object, the inventor has found that a dye-sensitized photoelectric conversion device using a semiconductor fine particle treated with a particular compound is excellent in photoelectric conversion efficiency. The present invention has been accomplished by the finding.

Thus, a method of the present invention is a method for producing a photoelectric conversion device comprising a conductive support and a photosensitive layer containing a semiconductor fine particle on which a dye is adsorbed, wherein the semiconductor fine particle is treated with a compound represented by the following general formula (I):

(I)

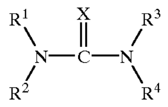

In the general formula (a), X represents an oxygen atom, a sulfur atom, a selenium atom or NY, in which Y represents a hydrogen atom, an aliphatic hydrocarbon group, a hydroxyl group or an alkoxy group; $R^1$, $R^2$, $R^3$ and $R^4$ independently represent a hydrogen atom, an aliphatic hydrocarbon group, an aryl group, a heterocyclic group, $—N(R^5)(R^6)$, $—C(=O)R^7$, $—C(=S)R^8$, $—SO_2R^9$ or $—OR^{10}$; $R^5$ and $R^6$ independently have the same meaning as $R^1$, $R^2$, $R^3$ and $R^4$; $R^7$, $R^8$ and $R^9$ independently represent a hydrogen atom an aliphatic hydrocarbon group, an aryl group, a heterocyclic group, $—N(R^5)(R^6)$, $—OR^{10}$ or $—SR^{11}$; and $R^{10}$ and $R^{11}$ independently represent a hydrogen atom or an aliphatic hydrocarbon group.

In the method for producing a photoelectric conversion device of the present invention, it is preferred that the semiconductor fine particle is treated with a solution comprising the compound represented by the general formula (I). The semiconductor fine particle is preferably treated with the compound represented by the general formula (I) after or while the dye is adsorbed on the semiconductor fine particle.

In the general formula (I), X is preferably an oxygen atom. The compound represented by the general formula (I) preferably has $—Si(R^{12})(R^{13})(R^{14})$, in which $R^{12}$, $R^{13}$ and $R^{14}$ independently represent a hydroxyl group, an alkoxy group, a halogen atom, an isocyanate group or an aliphatic hydrocarbon group, at least one of $R^{12}$, $R^{13}$ and $R^{14}$ being an alkoxy group, a halogen atom or an isocyanate group.

In the method for producing a photoelectric conversion device of the present invention, it is preferable that the semiconductor fine particle is treated with the compound represented by the general formula (I) and a compound represented by the following general formula (II):

$$M_p \cdot Z_q \qquad (II)$$

wherein M represents an alkaline metal ion, an alkaline earth metal ion, an ammonium ion, an imidazolium ion or a pyridinium ion; Z represents a halide ion, a carboxylate ion, a sulfonate ion, a phosphonate ion, a bis-sulfonylimide ion, a tris-sulfonylmethide ion, a sulfate ion, a thiocyanate ion, a cyanate ion, a perchlorate ion, a tetrafluoroborate ion or a hexafluorophosphate ion; and p and q independently represent an integer of 1 or more. In the general formula (II), Z is particularly preferably an iodide ion.

If the semiconductor fine particle is treated with the compound represented by the general formula (I) and the compound represented by the general formula (II), the semiconductor fine particle is preferably treated with a solution comprising the compound represented by the general formula (I) and a solution comprising the compound represented by the general formula (II), or with a solution comprising the compound represented by the general formula (I) and the compound represented by the general formula (II). It is particularly preferred that the semiconductor fine particle is treated with the compound represented by the general formula (I) while the dye is adsorbed on the semiconductor fine particle, and the semiconductor fine particle is then treated with the compound represented by the general formula (II). In this case, M in the general formula (II) is particularly preferably a quaternary ammonium ion. Further, it is also particularly preferred that the semiconductor fine particle is treated with the compound represented by the general formula (II) while the dye is adsorbed on the semiconductor fine particle, and the semiconductor fine particle is then treated with the compound represented by the general formula (I). In this case, M in the general formula (II) is particularly preferably a lithium ion.

In the case where the semiconductor fine particle is treated with the compound represented by the general formula (I) after the dye is adsorbed thereon, the semiconductor fine particle is particularly preferably treated with a compound having a basic group while the semiconductor fine particle is treated with the compound represented by the general formula (I). The compound having a basic group is preferably pyridine or a derivative thereof. Further, the dye used in the present invention is preferably a ruthenium complex dye.

A photoelectric conversion device of the present invention is obtainable by the above-mentioned method of the present invention. A photoelectric cell of the present invention comprises the photoelectric conversion device.

DETAILED DESCRIPTION OF THE PREFERRED EMBODIMENTS

Figure 1:
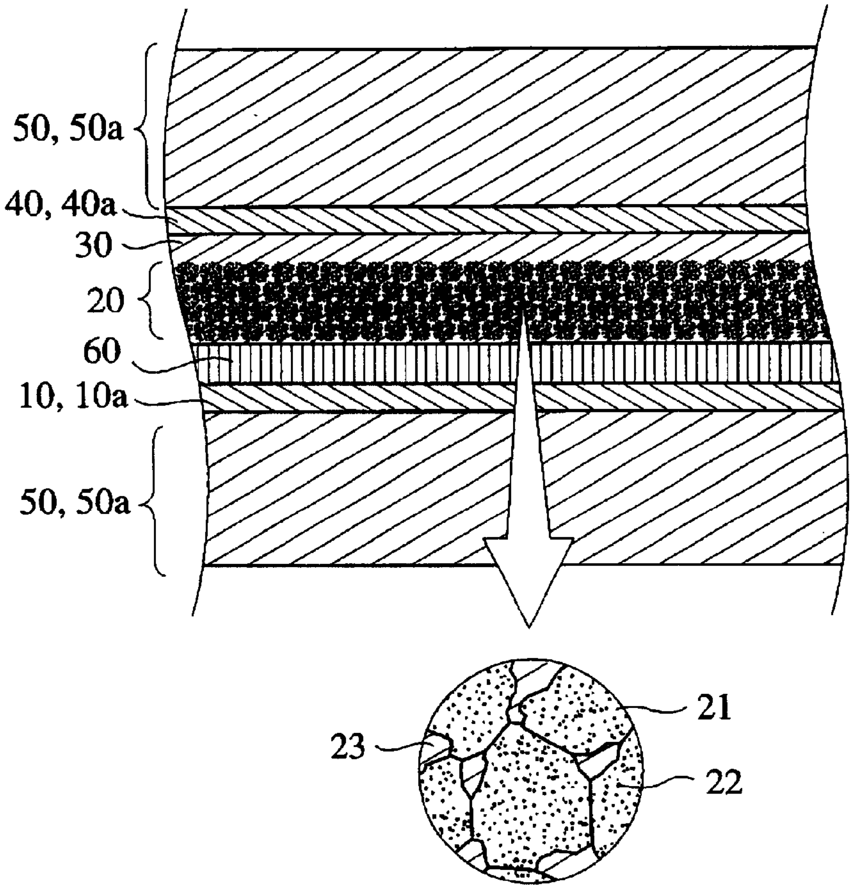
FIG. 1 is a partial cross sectional view showing a preferable structure of a photoelectric conversion device of the present invention.

A photoelectric conversion device of the present invention comprises a conductive support and a photosensitive layer disposed thereon. The photosensitive layer contains a semiconductor fine particle on which a dye is adsorbed. In a method for producing a photoelectric conversion device of the present invention, the semiconductor fine particle is treated with a compound represented by the following general formula (I) to improve conversion efficiency of the photoelectric conversion device. The compound represented by the general formula (I) is hereinafter referred to as "compound (I)." Further, it is preferable that the semiconductor fine particle is treated with the compound (X) and a compound represented by the following general formula (II). The compound represented by the general formula (II) is hereinafter referred to as "compound (II)."

(I)

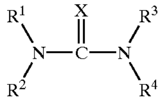

(II)

$$M_p \cdot Z_q$$

The compound (I), the compound (II), the method for treating the semiconductor fine particle with the compound (I), the method for treating the semiconductor fine particle with both of the compounds (I) and (II), the photoelectric conversion device of the present invention, and a photoelectric cell of the present invention will be described in detail below.

[I] Compound (I)

(I)

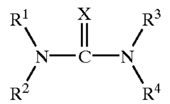

In the general formula (I), X represents an oxygen atom, a sulfur atom, a selenium atom or NY, in which Y represents a hydrogen atom, an aliphatic Ad hydrocarbon group, a hydroxyl group or an alkoxy group. Examples of the aliphatic hydrocarbon group represented by Y include straight, branched or cyclic, substituted or unsubstituted alkyl groups having 1 to 10 carbon atom such as methyl group, ethyl group, n-propyl group, i-propyl group, cyclohexyl group and carboxymethyl group. Examples of the alkoxy group represented by Y include methoxy group, ethoxy group, i-propoxy group, etc. X is preferably an oxygen atom.

In the general formula (I), $R^1$, $R^2$, $R^3$ and $R^4$ independently represent a hydrogen atom, an aliphatic hydrocarbon group, an aryl group, a heterocyclic group, —N($R^5$)($R^6$), —C(=O)$R^7$, —C(=S)$R^8$, —$SO_2R^9$ or —$OR^{10}$. Herein, $R^5$ and $R^6$ independently have the same meaning as $R^1$, $R^2$, $R^3$ and $R^4$; $R^7$, $R^8$ and $R^9$ independently represent a hydrogen atom, an aliphatic hydrocarbon group, an aryl group, a heterocyclic group, —N($R^5$)($R^6$), —$OR^{10}$ or —$SR^{11}$; and $R^{10}$ and $R^{11}$ independently represent a hydrogen atom or an aliphatic hydrocarbon group.

Examples of the aliphatic hydrocarbon group represented by $R^1$, $R^2$, $R^3$ and $R^4$ include: straight or branched, unsubstituted alkyl groups having 1 to 30 carbon atom such as methyl group, ethyl group, i-propyl group, n-propyl group, n-butyl group, t-butyl group, 2-pentyl group, n-hexyl group, n-octyl group, t-octyl group, 2-ethylhexyl group, 1,5-dimethylhexyl group, n-decyl group, n-dodecyl group, n-tetradecyl group, n-hexadecyl group and n-octadecyl group; straight or branched, substituted alkyl groups having 1 to 30 carbon atom such as N,N-dimethylaminopropyl group, trifluoroethyl group, tri-n-hexylammoniumpropyl group, pyridylpropyl group, triethoxysilylpropyl group, trimethoxysilylpropyl group, trichlorosilylmethyl group, carboxymethyl group, sulfoethyl group, sulfomethyl group, phosphopropyl group, dimethoxyphosphopropyl group, n-butoxypropyl group, methoxyethoxyethyl group, polyethoxyethyl groups, acetyloxyethyl group, methylthiopropyl group and 3-(N-ethylureido)propyl group; substituted or unsubstituted, cyclic alkyl groups having 3 to 18 carbon atoms such as cyclopropyl group, cyclopentyl group, cyclohexyl group, cycloctyl group, adamanthyl group and cyclododecyl group; alkenyl groups having 2 to 16 carbon atoms such as allyl group, 2-butenyl group and 3-pentenyl group; alkynyl groups having 2 to 10 carbon atoms such as propargyl group and 3-pentynyl group; aralkyl groups having 6 to 16 carbon atoms such as benzyl group; etc.

Examples of the aryl group represented by $R^1$, $R^2$, $R^3$ and $R^4$ include: substituted or unsubstituted phenyl groups having 6 to 30 carbon atoms such as unsubstituted phenyl group, methylphenyl group, octylphenyl group, cyanophenyl group, ethoxycarbonylphenyl group, diethylphosphomethylphenyl group, sulfophenyl group, dimethylaminophenyl group, trimethoxysilylphenyl group, trifluoromethylphenyl group, carboxyphenyl group and butoxyphenyl group; substituted or unsubstituted naphtyl groups such as unsubstituted naphtyl group, 4-sulfonaphtyl group; etc.

Examples of the heterocyclic group represented by $R^1$, $R^2$, $R^3$ and $R^4$ include: substituted or unsubstituted, nitrogen-containing, 5-membered heterocyclic group such as imidazolyl group, benzimidazolyl group and pyrrole group; substituted or unsubstituted, nitrogen-containing, 6-membered heterocyclic group such as pyridyl group, quinolyl group, pyrimidyl group, triazino group and morpholino group; furyl group; thiofuryl group; etc.

$R^1$, $R^2$, $R^3$ and $R^4$ may independently represent —$OR^{10}$, in which $R^{10}$ is a hydrogen atom or an aliphatic hydrocarbon group with examples being the same as those of the above-mentioned aliphatic hydrocarbon group represented by $R^1$, $R^2$, $R^3$and $R^4$.

$R^1$, $R^2$, $R^3$ and $R^4$ may independently represent —$N(R^5)(R^6)$, in which $R^5$ and $R^6$ independently have the same meaning as $R^1$, $R^2$, $R^3$ and $R^4$.

$R^7$, $R^8$ and $R^9$ of —$(C{=}O)R^7$, —$C({=}S)R^8$ and $SO_2R^9$ represented by $R^1$, $R^2$, $R^3$ and $R^4$ are independently a hydrogen atom, an aliphatic hydrocarbon group, an aryl group, a heterocyclic group, —$N(R^5)(R^6)$, —$OR^{10}$ or —$SR^{11}$. $R^{10}$ and $R^{11}$ independently represent a hydrogen atom or an aliphatic hydrocarbon group with examples being the same as the above-described examples of those represented by $R^1$, $R^2$, $R^3$ and $R^4$. Examples of the aliphatic hydrocarbon group, the aryl group, the heterocyclic group and —$N(R^5)(R^6)$ represented by $R^7$, $R^8$ and $R^9$ include the groups described above as examples of those represented by $R^1$, $R^2$, $R^3$ and $R^4$.

Each of $R^1$, $R^2$, $R^3$ and $R^4$ is preferably a hydrogen atom, a substituted or unsubstituted alkyl group having 1 to 20 carbon atom, a substituted or unsubstituted phenyl group having 6 to 20 carbon atoms, a nitrogen-containing heterocyclic group, —$N(^5)(R^6)$, —$C({=}O)R^7$ or —$SO_2R^9$, more preferably a hydrogen atom, a substituted or unsubstituted allyl group having 1 to 18 carbon atom, a substituted or unsubstituted phenyl group having 6 to 18 carbon atoms or a nitrogen-containing, 6-membered heterocyclic group, furthermore preferably a hydrogen atom, a substituted or unsubstituted allyl group having 1 to 16 carbon atom or a substituted or unsubstituted phenyl group having 6 to 16 carbon atoms, particularly preferably a hydrogen atom or a substituted or unsubstituted alkyl group having 1 to 16 carbon atom. Further, it is preferable that at least one of $R^1$, $R^2$, $R^3$ and $R^4$ represents a hydrogen atom, and it is more preferable that three or more of $R^1$, $R^2$, $R^3$ and $R^4$ represent a hydrogen atom.

X, $R^1$, $R^2$, $R^3$ and $R^4$ in the general formula (I) may be bonded together to form a ring, respectively.

Preferable embodiments of $R^5$ and $R^6$ are the same as those of $R^1$, $R^2$, $R^3$ and $R^4$, and each of $R^7$, $R^8$ and $R^9$ preferably represents a substituted or unsubstituted alkyl group having 1 to 12 carbon atom or —$N(R^5)(R^6)$.

X, $R^1$, $R^2$, $R^3$ and $R^4$ of the compound (I) may have a substituent. The substituent are preferably —$C({=}O)OR^1$, —$P({=}O)(OR')_2$, —$S({=}O)OR'$, —$OR'$, —$B(OR')_2$ or —$Si(R^{12})(R^{13})(R^{14})$. Herein, R' represents a hydrogen atom or an aliphatic hydrocarbon group such as methyl group and ethyl group. Further, $R^{12}$, $R^{13}$ and $R^{14}$ independently represent: a hydroxyl group; an alkoxy group such as methoxy group, ethoxy group and i-propyl group; a halogen atom such as a chlorine atom; an isocyanate group; or an aliphatic hydrocarbon group such as methyl group and ethyl group. At least one of $R^{12}$, $R^{13}$ and $R^{14}$ is an alkoxy group, a halogen atom or an isocyanate group. The substituent are more preferably —$C({=}O)OR'$, —$P({=}O)(OR')_2$ or —$Si(R^{12})(R^{13})(R^{14})$, particularly preferably —$Si(R^{12})(R^{13})(R^{14})$. The compound (I) preferably has at least one —$Si(R^{12})(R^{13})(R^{14})$.

If the compound (I) carries a charge, the charge may be neutralized by counter ion. The counter ion may be an anion or a cation, and may be organic or inorganic. Typical examples of the anion include: halide ions such as fluoride ion, chloride ion, bromide ion and iodide ion; perchlorate ion; tetrafluoroborate ion; hexafluorophosphate ion; acetate ion; trifluoroacetate ion; methane sulfonate ion; p-toluene sulfonate ion; trifluoromethane sulfonate ion; bis (trifluoroethanesulfonyl)imide ion; tris (trifluoromethanesulfonyl)methide ion; etc. Typical examples of the cation include: alkali metal ions such as lithium ion, sodium ion and potassium ion; alkaline earth metal ions such as magnesium ion and calcium ion; substituted or unsubstituted ammonium ions such as unsubstituted ammonium ion, triethyl ammonium ion and tetramethyl ammonium ion; substituted or unsubstituted pyridinium ions such as unsubstituted pyridinium ion and 4-phenylpyridinium ion; substituted or unsubstituted imidazolium ions such as N-methylimidazolium ion; etc.

Specific examples of the compound (I) will be illustrated below without intention of restricting the scope of the present invention defined by the claims attached hereto.

(I-1)

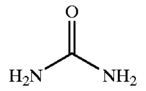

(I-2)

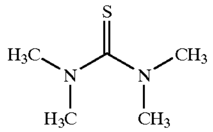

(I-3)

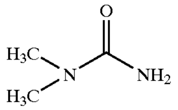

(I-4)

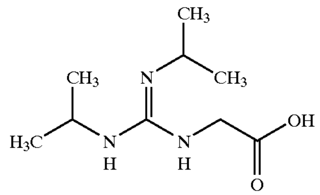

(I-5)

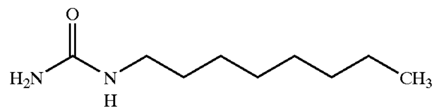

(I-6)

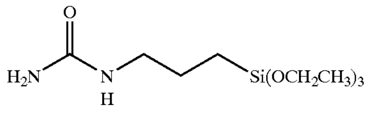

-continued
(I-7)
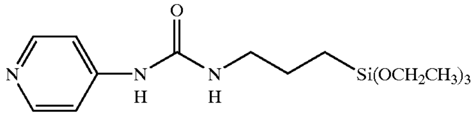
(I-8)
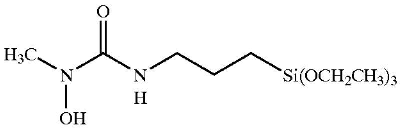
(I-9)
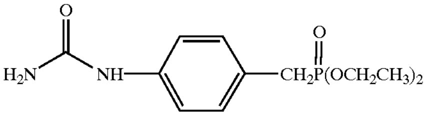
(I-10)
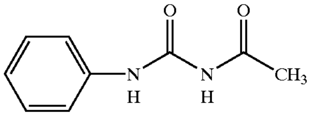
(I-11)
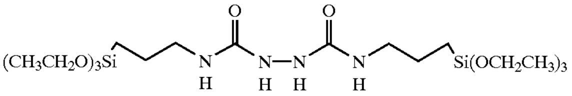
(I-12)
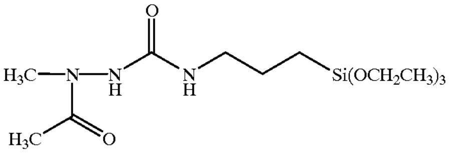
(I-13)
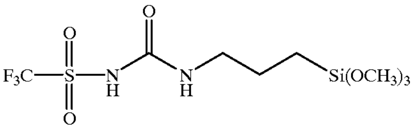
(I-14)
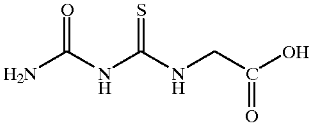
(I-15)
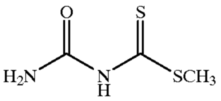
(I-16)
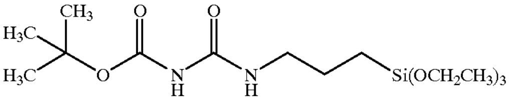
(I-17)
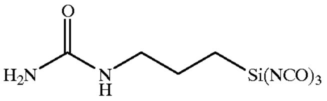
-continued
(I-18)
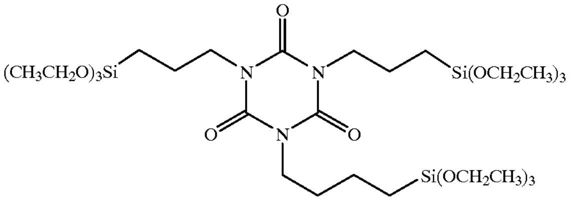
(I-19)
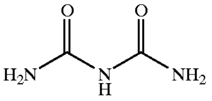
(I-20)
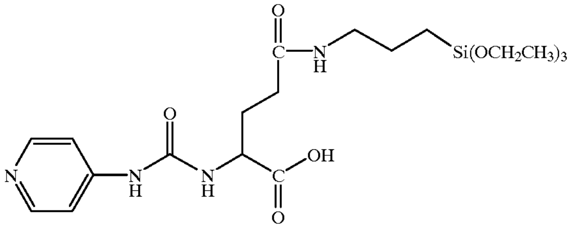
(I-21)
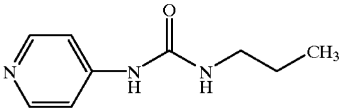
(I-22)
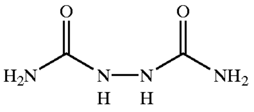
(I-23)
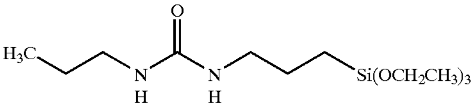
(I-24)
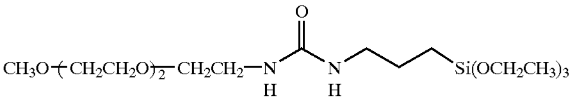
(I-25)
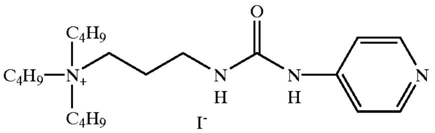
(I-26)
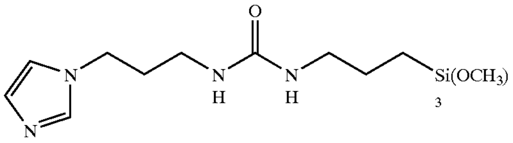
(I-27)
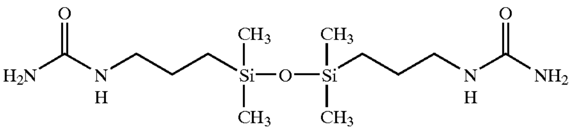

-continued (I-28)

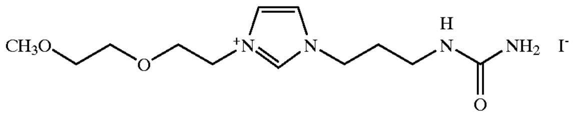

(I-29)

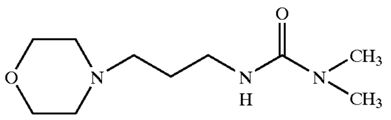

(I-30)

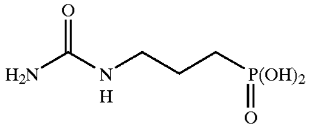

(I-31)

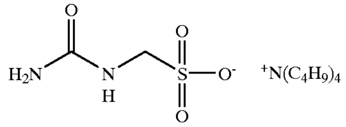

(I-32)

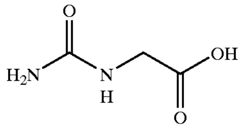

(I-33)

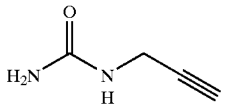

(I-34)

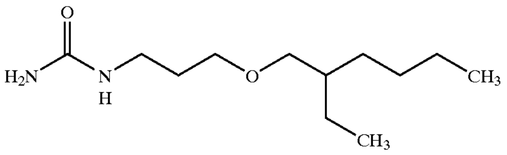

(I-35)

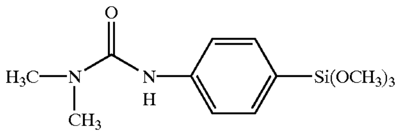

(I-36)

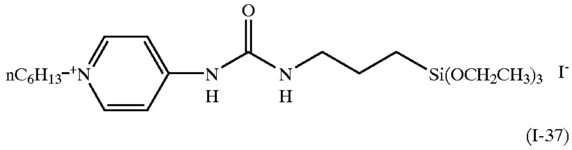

(I-37)

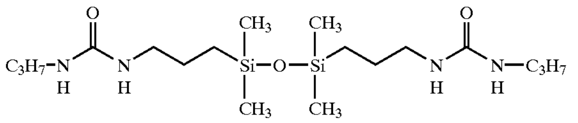

-continued (I-38)

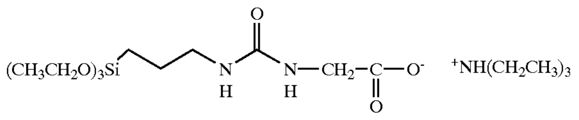

[II] Compound (II)

It is preferable that the semiconductor fine particle is treated with each of the compound (I) and the compound (II).

$$M_p \cdot Z_q \quad \text{(II)}$$

In the general formula (II), M represents an alkali metal ion, an alkaline earth metal ion, an ammonium ion, an imidazolium ion or a pyridinium ion. Examples of the alkali metal ion include lithium ion, sodium ion, potassium ion, rubidium ion, cesium ion, etc. Examples of the alkaline earth metal ion include magnesium ion, calcium ion, strontium ion, etc. Examples of the ammonium ion include unsubstituted ammonium ion, triethylammonium ion, tetramethylammonium ion, tetra-n-butylammonium ion, tetra-n-hexylammonium ion, ethyltrimethylammonium ion, etc. Examples of the imidazolium ion include unsubstituted imidazolium ion, 1,3-dimethylimidazolium ion, 1-ethyl-3-methylimidazolium ion, 1-butyl-3-methylimidazolium ion, 2,3-dimethyl-1-propylimidazolium ion, etc. Examples of the pyridinium ion include unsubstituted pyridinium ion, N-methyl pyridinium ion, 4-phenylpyridinium ion, etc. M preferably represents an alkali metal ion, an alkaline earth metal ion, a quaternary ammonium ion or an imidazolium ion.

In the general formula (II), Z represents a halide ion, a carboxylate ion, a sulfonate ion, a phosphonate ion, a bis-sulfonylimide ion, a tris-sulfonylmethide ion, a sulfate ion ($SO_4^{2-}$), a thiocyanate ion ($NCS^-$), a cyanate ion ($NCO^-$), a perchlorate ion ($ClO_4^-$), a tetrafluoroborate ion ($BF_4^-$) or a hexafluorophosphate ion ($PF_6^-$). Examples of the halide ion include fluoride ion, chloride ion, bromide ion, iodide ion, etc. Examples of the carboxylate ion include substituted or unsubstituted alkyl or aryl carboxylate ions having 1 to 18 carbon atom such as acetate ion, propionate ion, benzoate ion, trichloroacetate ion and trifluoroacetate ion, etc. Examples of the sulfonate ion include substituted or unsubstituted alkyl or aryl sulfonate ions having 1 to 18 carbon atom such as methanesulfonate ion, p-toluenesulfonate ion, trifluoromethanesulfonate ion and perfluoroctanesulfonate ion, etc. Examples of the phosphonate ion include substituted or unsubstituted alkyl or aryl phosphonate ions having 1 to 18 carbon atom such as benzylphosphonate ion, etc. Examples of the bis-sulfonylimide ion include bis(trifluoromethanesulfonyl) imide ion, etc. Examples of the tris-sulfonylmethide ion include tris(trifluoromethanesulfonyl)methide ion, etc. Z is preferably iodide ion, acetate ion, trifluoroacetate ion, methanesulfonate ion, p-toluenesulfonate ion, trifluoromethanesulfonate ion, bis(trifluoromethanesulfonyl)imide ion, thiocyanate ion, perchlorate ion, tetrafluoroborate ion or hexafluorophosphate ion, more preferably iodide ion, trifluoromethanesulfonate ion, bis(trifluoromethanesulfonyl) imide ion, perchlorate ion or tetrafluoroborate ion.

In the general formula (II), p indicating the number of M and q indicating the number of Z independently represent an integer of 1 or more. p and q is preferably 1 or 2, respectively. p and q are preferably selected so that charges of M and Z are neutralized, for example, it is preferable that p is 2 and q is 1 when M is a monovalent cation and Z is a bivalent anion.

Specific examples of the compound (II) will be illustrated below without intention of restricting the scope of the present invention defined by the claims attached hereto.

(II-1)

LiI (II-2)

NaI (II-3)

KI (II-4)

RbI (II-5)

CsI (II-6)

$MgI_2$ (II-7)

$SrI_2$ (II-8)

$LiBF_4$ (II-9)

$LiPF_6$ (II-10)

$CH_3CO_2Li$ (II-11)

NaSCN (II-12)

KOCN (II-13)

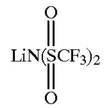

(II-14)

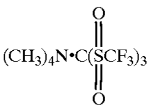

(II-15)

$LiClO_4$ (II-16)

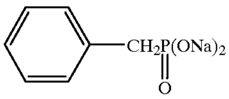

(II-17)

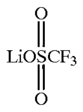

(II-18)

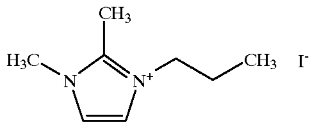

-continued (II-19)

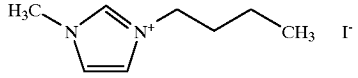

(II-20)

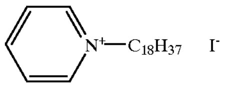

(II-21)

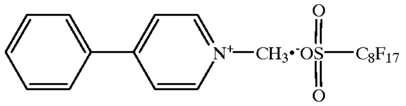

(II-22)

$(C_6H_{13})_4NI$ (II-23)

$(C_8H_{17})_4NI$ (II-24)

$(C_4H_9)_4N{\bullet}BF_4$ (II-25)

$\{(C_{12}H_{25})_4N\}_2SO_4$

[III] Method for Treating Semiconductor Fine Particle (A) Treatment with Compound (I)

In the method for producing a photoelectric conversion device of the present invention, the semiconductor fine particle is treated with the compound (I). The term "the semiconductor fine particle is treated with the compound (I)" means that the semiconductor fine particle is made to come into contact with the compound (I) for a predetermined period before a charge transfer layer is disposed in the photoelectric conversion device. It does not matter whether the compound (I) is adsorbed on the semiconductor fine particle or not after the treatment.

Although the semiconductor fine particle may be treated with the compound (I) in any process during production of the photoelectric conversion device, it is preferably treated with the compound (I) after a layer of semiconductor fine particle is provided. It is preferred that the semiconductor fine particle is treated with a solution prepared by dissolving the compound (I) in a solvent, hereinafter referred to as "treatment solution (I)," or with a dispersion prepared by dispersing the compound (I) in a solvent, hereinafter referred to as "treatment dispersion (I)." If the compound (I) is liquid, it may be used without a solvent. It is more preferable that the semiconductor fine particle is treated with the treatment solution (I).

The solvent used for the treatment solution (I) or the treatment dispersion (I) is preferably an organic solvent. The organic solvent may be properly selected depending on the solubility of the compound (I). Examples of the organic solvent include: alcohol solvents such as methanol, ethanol, t-butanol and benzylalcohol; nitrile solvents such as acetonitrile, propionitrile and 3-methoxypropionitrile; nitromethane; halogenated hydrocarbons such as dichloromethane, dichloroethane, chloroform and chlorobenzene; ether solvents such as diethylether and tetrahydrofuran; dimethylsulfoxide; amide solvents such as N,N-dimethylformamide and N,N-dimethylacetamide; N-methylpyrrolidone; 1,3-dimethylimidazolidinone; 3-methyloxazolidinone; ester solvents such as ethyl acetate and butylacetate; carbonate solvents such as diethyl carbonate, ethylene carbonate and propylene carbonate; ketone solvents such as acetone, 2-butanone and cyclohexanone; hydrocarbon solvents such as hexane, petroleum ether, benzene and toluene; mixtures thereof; etc. Among them, particularly preferred are alcohol solvents, nitrile solvents and amide solvents.

The semiconductor fine particle may be treated with the compound (I) by: (a) a method where it is treated with the compound (I) after the dye is adsorbed thereon, hereinafter referred to as "after-treatment method"; (b) a method where it is treated with the compound (I) while the dye is adsorbed thereon, hereinafter referred to as "simultaneous treatment method"; or (c) a method where it is treated with the compound (I) before the dye is adsorbed thereon, hereinafter referred to as "pre-treatment method." Of these methods, preferred are the after-treatment method and the simultaneous treatment method. Further, these methods may be used in combination therewith, thus, the semiconductor fine particle may be successively or stepwise treated with the compound (I) a plurality of times. For example, two step treatment method comprising the simultaneous treatment method and the after-treatment method is preferably used in this invention. In the case where a plurality of treatments with the compound (I) are carried out, the compounds (I) used for each treatment may be the same or different.

In the case of using the treatment solution (I) or the treatment dispersion (I), wherein both of them are hereinafter referred to as "treatment liquid (I)", the semiconductor fine particle layer is preferably treated with the treatment liquid (I) by a dipping treatment method where the layer is dipped into the treatment liquid (I). Further, the semiconductor fine particle may be treated with the treatment liquid (I) by a spraying treatment method where the treatment liquid (I) is sprayed on the particle in the after-treatment method or the pre-treatment method. In the dipping treatment method, although the temperature of the treatment liquid (I) and the treatment period may be optionally selected, it is preferable that the treatment is carried out at 20 to 80° C. for 30 seconds to 24 hours. After the dipping treatment, the semiconductor fine particle is preferably washed with a solvent. The solvent is preferably the same as that used for the treatment liquid (I), or a polar solvent such as a nitrile solvent, an alcohol solvent or an amide solvent.

The treatment liquid (I) may contain an additive in addition to the compound (I). For example, a surface active, colorless compound may be co-adsorbed onto the semiconductor fine particle together with the dye to weaken an interaction between the dyes such as association. Examples of the additive include: steroid compounds having a carboxyl group such as chenodeoxycholic acid and cholic acid; ultraviolet absorbing agents; surfactants; etc.

The semiconductor fine particle is preferably treated with a compound having a basic group before or after the dye is adsorbed on the particle. Thus, in the after-treatment method and the pre-treatment method, it is preferable that the treatment liquid (I) contains a compound having a basic group. It is particularly preferable that the semiconductor fine particle is treated with a compound having a basic group while it is treated with the compound represented by the general formula (I) after the dye is adsorbed thereon. Herein, the basic group is such a group that a conjugate acid of a compound obtained by adding a hydrogen atom to the basic group has a pKa value of 3 to 15. The pKa value of the conjugate acid is measured in a mixture solvent of tetrahydrofuran/water=1/1 at 25° C. Examples of the compound having a basic group include: pyridine compounds such as 4-methylpyridine, 4-t-butylpyridine and 4-methoxy pyridine; imidazole compounds such as imidazole and N-methylimidazole; 1,8-diazabicycloundecene; tertiary amine compounds such as triethylamine, diethylisopropylamine and 1,4-diazabicycloctane; etc. As the compound having a basic group, preferred are pyridine and derivatives thereof. The compound having a basic group may have an anionic group as 3-trifluoromethanesulfonamidopyridine, 1-ethyl-3-methylimidazolium salt, etc.

The concentration of the compound (I) in the treating liquid (I) is preferably $1\times10^{-6}$ to 2 mol/L, more preferably $1\times10^{-5}$ to $5\times10^{-1}$ mol/L.

(B) Treatment with Compound (I) and Compound (II)

As described above, the semiconductor fine particle is preferably treated with the compound (I) and the compound (II). The term "the semiconductor fine particle is treated with the compound (I) and the compound (II)" means that the semiconductor fine particle is made to come into contact with each of the compound (I) and the compound (II) for a predetermined period before the charge transfer layer is disposed in the photoelectric conversion device. It does not matter whether the compound (I) and the compound (II) is adsorbed on the semiconductor fine particle or not after the treatment, respectively.

Although the semiconductor fine particle may be treated with each of the compound (I) and the compound (II) in any process during production of the photoelectric conversion device, it is preferably treated therewith after a layer of semiconductor fine particle is provided. As is equal to the case of the compound (I), it is preferred that the semiconductor fine particle is treated with a solution prepared by dissolving the compound (II) in a solvent, hereinafter referred to as "treatment solution (II)," or with a dispersion prepared by dispersing the compound (II) in a solvent, hereinafter referred to as "treatment dispersion (II)." If the compound (II) is liquid, it may be used without a solvent. It is more preferable that the semiconductor fine particle is treated with the treatment solution (II). The solvent used for the treatment solution (II) or the treatment dispersion (II) is preferably an organic solvent with examples being the same as those of the above-mentioned solvent used for the compound As is equal to the case of the treatment with only the compound (I), the semiconductor fine particle may be treated with the compounds (I) and (II) by the after-treatment method, the simultaneous treatment method or the pre-treatment method. Of these, preferred are the after-treatment method and the simultaneous treatment method. Further, these methods may be used in combination therewith, thus, the semiconductor fine particle may be successively or stepwise treated with the compounds a plurality of times. For example, two step treatment method comprising the simultaneous treatment method and the after-treatment method is preferably used in this invention. In the case where a plurality of treatments with the compounds (I) and (II) are carried out, the compounds (I) and (II) used for each treatment may be the same or different.

Treatment with the compound (I) and treatment with the compound (II) may be carried out separately or simultaneously. The treatments is preferably carried out separately, particularly preferably carried out by: (i) a method where the semiconductor fine particle is treated with the compound (I) while the dye is adsorbed on the semiconductor fine particle, and it is then treated with the compound (II); or (ii) a method where the semiconductor fine particle is treated with the compound (II) while the dye is adsorbed on the semiconductor fine particle, and it is then treated with the compound (I).

In the case where the semiconductor fine particle is treated with the compound (II) after the dye is adsorbed thereon as the method of (i), M in the general formula (I) is more preferably a quaternary ammonium ion or an imidazolium ion, particularly preferably a quaternary ammonium ion having 6 to 18 carbon atoms. Z in the general formula (II) is particularly preferably iodide ion.

In the case where the semiconductor fine particle is treated with the compound (II) while the dye is adsorbed thereon as the method of (ii), M in the general formula (II) is more preferably an alkaline metal ion or an alkaline earth metal ion, particularly preferably a lithium ion. Z in the general formula (II) is particularly preferably iodide ion.

In the case of using the treatment solution (II) or the treatment dispersion (II), wherein both of them are hereinafter referred to as "treatment liquid (II)", the semiconductor fine particle layer is preferably treated with the treatment liquid (II) by a dipping treatment method. Further, the semiconductor fine particle may be treated with the treatment liquid (II) by a spraying treatment method in the after-treatment method or the pre-treatment method. In the dipping treatment method, the temperature of the treatment liquid (II) and the treatment period may be optionally selected as is equal to the case of the treatment liquid (I).

The treatment liquid (II) may contain an additive such as a steroid compound having a carboxyl group, ultraviolet absorbing agents, surfactants, etc. or a compound having a basic group as is equal to the case of the treatment liquid (I). In particular, it is extremely preferable that to the treatment liquid (I) used in the method of (ii) is added a compound having a basic group. In this case, the compound having a basic group is preferably pyridine or a derivative thereof.

The concentration of the compound (II) in the treating liquid (II) is preferably $1\times10^{-6}$ to 2 mol/L, more preferably $1\times10^{-5}$ to $5\times10^{-1}$ mol/L.

[IV] Photoelectric Conversion Device

As shown in FIG. 1, the photoelectric conversion device of the present invention preferably comprises: an electrically conductive layer 10; a photosensitive layer 20 containing semiconductor fine particles 21 sensitized by dyes 22 and an charge-transporting material 23 penetrated into voids among the particles; a charge transfer layer 30; and a counter electrically conductive layer 40 laminated in this order. An undercoating layer 60 may be disposed between the electrically conductive layer 10 and the photosensitive layer 20. The charge-transporting material 23 is generally the same as the material used for the charge transfer layer 30. On the electrically conductive layer 10 and/or the counter electrically conductive layer 40 may be disposed a substrate 50 to improve the strength of the photoelectric conversion device. In the present invention, a layer composed of the electrically conductive layer 10 and the substrate 50 disposed thereon if necessary is referred to as "conductive support", and a layer composed of the counter electrically conductive layer 40 and the substrate 50 disposed thereon if necessary is referred to as "counter electrode." Incidentally, the electrically conductive layer 10, the counter electrically conductive layer 40 and the substrate 50 shown in FIG. 1 may be a transparent electrically conductive layer 10*a*, a transparent counter electrically conductive layer 40*a* and a transparent substrate 50*a*, respectively.

A photoelectric cell is constituted by connecting the photoelectric conversion device to an external circuit to electrically work or generate electricity in the external circuit. A photosensor is such a photoelectric conversion device as sensing optical information. Such a photoelectric cell that has the charge transfer layer composed of ion conductive material is referred to as a photo-electrochemical cell. A photoelectric cell intended for power generation using solar light is referred to as a solar cell.

In the photoelectric conversion device shown in FIG. 1, in the case of using an n-type semiconductor fine particle, a light injected to the photosensitive layer 20 excites the dye 22, etc., excited high energy electrons therein are transported to a conduction band of the semiconductor fine particles 21, and they are diffused to reach to the electrically conductive layer 10. At this time, the dye 22 is in oxidized form. In a photoelectric cell composed of the photoelectric conversion device, electrons in the electrically conductive layer 10 are returned to the oxidized dye through the counter electrically conductive layer 40 and the charge transfer layer 30 while working in the external circuit, so that the dye 22 is regenerated. The photosensitive layer 20 generally acts as a negative electrode or a photoanode, and the counter electrically conductive layer 40 generally acts as a positive electrode. In a boundary of each layer such as a boundary between the electrically conductive layer 10 and the photosensitive layer 20, a boundary between the photosensitive layer 20 and the charge transfer layer 30, a boundary between the charge transfer layer 30 and the counter electrically conductive layer 40, etc., components of each layer may be diffused and mixed.

Each layer comprised in the photoelectric conversion device of the present invention will be explained in detail below.

(A) Conductive Support

The conductive support is composed of (1) a single layer of the electrically conductive layer, or (2) two layers of the electrically conductive layer and the substrate. In the case of (1), the electrically conductive layer is preferably made of a material that has a sufficient strength and that can sufficiently seal the photoelectric conversion device, for example, a metal such as platinum, gold, silver, copper, zinc, titanium, aluminum and an alloy composed thereof. In the case of (2), the substrate on which the electrically conductive layer containing an electrically conductive material is disposed at the photosensitive layer side may be used as the conductive support. Preferable examples of the electrically conductive material include: metals such as platinum, gold, silver, copper, zinc, titanium, aluminum, indium and alloys composed thereof; carbon; electrically conductive metal oxides such as indium-tin composite oxides and tin oxides doped with fluorine or antimony; etc. The electrically conductive layer preferably has a thickness of 0.02 to 10 $\mu$M.

The surface resistance of the conductive support is desirable as low as possible. The surface resistance is preferably 50 Ω/square or less, more preferably 20 Ω/square or less.

When light is irradiated from the conductive support side, it is preferred that the conductive support is substantially transparent. Herein, the term "substantially transparent" means that the light transmittance is 10% or more to a light in visible region to near infrared region (400 to 1200 nm). The light transmittance is preferably 50% or more, more preferably 80% or more. The conductive support particularly preferably has high light transmittance to a light that the photosensitive layer has sensitivity to.

The transparent conductive support is preferably constituted by disposing the transparent electrically conductive layer of an electrically conductive metal oxide on the transparent substrate of such material as a glass and a plastic by means of coating or vapor deposition. The transparent electrically conductive layer is preferably made of tin dioxide doped with fluorine or antimony, or indium-tin oxide (ITO). The transparent substrate may be made of a glass such as low-cost soda glass excellent in strength and non-alkali glass that is not affected by alkaline elution. Additionally, a transparent polymer film is preferably used as the transparent substrate. Used as the materials for the transparent polymer film may be tetracetylcellulose (TAC), polyethylene terephthalate (PET), polyethylene naphthalate (PEN), syndiotactic polystyrene (SPS), polyphenylene-sulfide (PPS), polycarbonate (PC), polyarylate (PAr), polysulfone (PSF), polyestersulfone (PES), polyimide (PI), polyetherimide (PEI), cyclic polyolefin, brominated phenoxy resin, etc. To secure a sufficient transparency, the coating amount of the electrically conductive metal oxide is preferably 0.01 to 100 g per 1 $m^2$ of the glass or plastic substrate.

It is preferable that a metal lead is used to reduce the resistance of the transparent conductive support. The metal lead is preferably made of a metal such as platinum, gold, nickel, titanium, aluminum, copper, silver, etc. It is preferable that the metal lead is provided on the transparent substrate by a vapor deposition method, a sputtering method, etc., the transparent electrically conductive layer of conductive tin oxide, ITO, etc. being disposed thereon. The reduction in incident light quantity owing to the metal lead is suppressed to preferably 10% or less, more preferably 1 to 5%.

(B) Photosensitive Layer

The photosensitive layer contains the semiconductor fine particle on which the dye is adsorbed. In the photosensitive layer, the semiconductor fine particle acts as a photosensitive substance to absorb a light and conduct charge separation, thereby generating electrons and positive holes. With respect to the dye-sensitized semiconductor fine particle, the light absorption and the generation of the electrons and the positive holes are primarily caused in the dye, and the semiconductor fine particle receives and conveys the electrons or the positive holes.

(1) Semiconductor

Used as the semiconductor may be: an elementary substance semiconductor such as silicon and germanium; a III-V series compound semiconductor; a metal chalcogenide such as a metal oxide, a metal sulfide, a metal selenide and a composite thereof; a compound having a perovskite structure such as strontium titanate, calcium titanate, sodium titanate, barium titanate and potassium niobate; etc. An n-type semiconductor is preferably used in the present invention, in which conductor electrons act as a carrier under photo-excitation condition to provide anode current.

Preferable examples of the metal chalcogenide include: oxide of titanium, tin, zinc, iron, tungsten, zirconium, hafnium, strontium, indium, cerium, yttrium lanthanum, vanadium, niobium or tantalum; sulfide of cadmium, zinc, lead, silver, antimony or bismuth; selenide of cadmium or lead; cadmium telluride; etc. Additionally, the other compound semiconductors such as phosphides of zinc, gallium, indium or cadmium, selenides of gallium-arsenic or copper-indium, copper-indium sulfide, etc. may be used in this invention. Further, composite semiconductors such as $MO_yS_z$ and $M_{1x}M_{2y}O_z$ are also preferably used in the present invention, wherein M, $M_1$ and $M_2$ independently represent a metal atom, O represents an oxygen atom, S represents a sulfur atom, and x, y and z represent numbers combined with each other to form a neutral molecule.

Preferable specific examples of the semiconductor include Si, $TiO_2$, $SnO_2$, $Fe_2O_3$, $WO_3$, ZnO, $Nb_2O_5$, CdS, ZnS, PbS, $Bi_2S_3$, CdSe, CdTe, $SrTiO_3$, GaP, InP, GaAs, $CuInS_2$ and $CuInSe_2$. Of these semiconductors, more preferred are $TiO_2$, $SnO_2$, $Fe_2O_3$, $WO_3$, ZnO, $Nb_2O_5$, CdS, PbS, CdSe, $SrTiO_3$, InP, GaAs, $CuInS_2$ and $CuInSe_2$, particularly preferred are $TiO_2$ and $Nb_2O_5$, and the most preferred is $TiO_2$. $TiO_2$ used in the present invention may contain anatase-type crystal structure of preferably 70 volume % or more, particularly preferably 100 volume %. It is preferable that the semiconductor is doped with a metal to increase electron conductivity thereof. This metal is preferably divalent or trivalent. Further, the semiconductor is preferably doped with a monovalent metal to prevent a reverse current from being provided from the semiconductor to the charge transfer layer.

The semiconductor may have a single crystal or poly crystal structure. The poly crystal semiconductor is preferred from the viewpoints of the production cost, the security of the raw materials, the energy-payback time, etc. The photosensitive layer is particularly preferably a porous semiconductor fine particle layer. The photosensitive layer may partly contain an amorphous semiconductor.

The particle size of the semiconductor fine particle is generally in the nm to μm level. The mean size of primary semiconductor particles, which is obtained from a diameter of a circle equivalent to a projected area thereof, is preferably 5 to 200 nm, more preferably 8 to 100 nm. Further, the mean size of secondary semiconductor particles in dispersion is preferably 0.01 to 30 μm.

Two or more of the semiconductor fine particles having a different particle size distribution may be mixed to use for the photosensitive layer. In this case, the average particle size of the smaller particles is preferably 25 nm or less, more preferably 10 nm or less. To improve a light-capturing rate of the photoelectric conversion device by scattering ray of incident light, the semiconductor fine particles having a large particle size, e.g. approximately 100 to 300 nm in diameter, may be used for the photosensitive layer.

Two or more kinds of the semiconductor fine particles may be used for the photosensitive layer. In this case, it is preferable that one is $TiO_2$, ZnO, $Nb_2O_5$ or $SrTiO_3$ and the other is $SnO_2$, $Fe_2O_3$ or $WO_3$. More preferred combination is ZnO and $SnO_2$, ZnO and $WO_3$, ZnO, $SnO_2$ and $WO_3$, etc. Each of the semiconductor fine particles may have a different diameter. Particularly preferred is a combination of $TiO_2$, ZnO, $Nb_2O_5$ or $SrTiO_3$ having a larger diameter and $SnO_2$, $Fe_2O_3$ or $WO_3$ having a smaller diameter. The larger diameter is preferably 100 nm or more, and the smaller diameter is preferably 15 nm or less.

Preferred as a method for producing the semiconductor fine particles are: sol-gel methods described in Sumio Sakka, "Zoru-Geru-Ho No Kagaku (Science of Sol-Gel Method)", Agune Shofusha (1998), Technical information Association, "Zoru-Germ-Ho Niyoru Hakumaku Coating Gijutu (Thin Film-Coating Technology by Sol-Gel Method)" (1995), etc.; and gel-sol methods described in Tadao Sugimoto, "Shin-Goseiho Geru-Zoru-Ho Niyoru Tanbunsanryusi No Gosei To Saizu-Keitaiseigyo (Synthesis of Mono-Dispersion Particles and Control of Their Size and Form by Novel Gel-Sol Method)", and MATERIA, Vol. 35, No. 9, Page 1012 to 1018 (1996). The method developed by Degussa Company, which comprises preparing oxides by subjecting chlorides to a high temperature hydrolysis in an oxyhydrogen salt, is also preferred.

In the case of using titanium oxide as the semiconductor fine particles, any of the above-described sol-gel methods, gel-sol methods and high temperature hydrolysis method are preferably used, further, a sulfuric acid method and a chlorine method described in Manabu Seino, "Sanka-Chitan Bussei To Ouyougijutu (Titanium oxide—Properties and Applied Technique)", Gihodo Shuppan, (1997) may be used. Of the sol-gel methods, also preferred are such that described in Christophe J. Barb'e, et al, Journal of American Ceramic Society, Vol. 80, No. 12, Page 3157 to 3171 (1997)

and Burnside, et al, Chemistry of Materials, Vol. 10, No. 9, Page 2419 to 2425.

(2) Semiconductor Fine Particle Layer

The semiconductor fine particles may be applied onto the conductive support by: a method where the conductive support is coated with a dispersion or a colloidal solution containing the particles; the above-mentioned sol-gel method; etc. A wet type film production method is relatively advantageous for the mass production of the photoelectric conversion device, improvement of properties of the semiconductor fine particle solution, and improvement of the adaptability of the conductive support, etc. As such a wet type film production method, coating methods, printing methods, electrolytic deposition methods and electrodeposition techniques are typical examples. Further, the semiconductor fine particle layer may be disposed by: oxidizing a metal; an LPD method where a metal solution is subjected to ligand exchange, etc.; a sputtering method; a vapor deposition method; a CVD method; or an SPD method where a thermal decomposition-type metal oxide precursor is sprayed on a heated substrate to generate a metal oxide.

The dispersion containing the semiconductor fine particles may be prepared by: the sol-gel methods mentioned above; crushing the semiconductor in a mortar; dispersing the semiconductor while grinding it in a mill; synthesizing and precipitating the semiconductor fine particles in a solvent; etc.

As a dispersion solvent, water or organic solvents such as methanol, ethanol, isopropyl alcohol, citronellol, terpineol, dichloromethane, acetone, acetonitrile, ethyl acetate, etc. may be used A polymer such as polyethylene glycol, hydroxyethylcellulose and carboxymethylcellulose, a surfactant, an acid, a chelating agent, etc. may be used as a dispersing agent, if necessary. In particular, it is preferable that polyethylene glycol is added to the dispersion because the viscosity of the dispersion and the porosity of the semiconductor fine particle layer can be controlled by changing the molecular weight of the polyethylene glycol, and the semiconductor fine particle layer containing polyethylene glycol is hardly peeled off.

Preferred coating methods include: a roller method and a dip method as an application series; an air-knife method and a blade method as a metering series; etc. Further, preferable as a method where an application and metering can be performed at the same time are a wire-bar method disclosed in JP-B-58-4589, a slide-hopper method described in U.S. Pat. Nos. 2,681,294, 2,761,419, 2,761,791, etc., an extrusion method, a curtain method, etc. Furthermore, as for a wide use, a spin method and a spray method are preferred. As a wet type printing method, three major printing methods of a relief printing, an offset printing and a gravure printing, an intaglio printing, a gum printing, a screen printing, etc. are preferred. A preferable film production method may be selected from these methods in accordance with the viscosity of the dispersion and the desired wet thickness.

The semiconductor fine particle layer is not limited to a single layer. The dispersions each comprising the semiconductor fine particles having a different particle size may be subjected to a multi-layer coating. Further, the dispersions each containing different kinds of semiconductor fine particles, binder or additives may be subjected to a multi-layer coating. The multi-layer coating is also effectively used when the thickness of the layer is insufficient by coating of once.

Generally, when the thickness of the semiconductor fine particle layer, equal to the thickness of the photosensitive layer, becomes thicker, the amount of the dye incorporated therein per unit of the projected area increases to make the light capturing rate higher. However, because diffusion distances of the generated electrons are increased in this case, loss owing to recombination of the electric charges is also increased. Consequently, the preferable thickness of the semiconductor fine particle layer is 0.1 to 100 $\mu$m. In the case of the photoelectric cell, the thickness of the semiconductor fine particle layer is preferably 1 to 30 $\mu$m, more preferably 2 to 25 $\mu$m. A coating amount of the semiconductor fine particles per 1 $m^2$ of the substrate is preferably 0.5 to 100 g, more preferably 3 to 50 g.

After applying the semiconductor fine particles onto the conductive support, the particles are preferably subjected to a heat treatment, to electronically contact them with each other and to increase the coating strength and the adherence thereof with the support. The heating temperature is preferably 40 to 700° C., more preferably 100 to 600° C. The heating time is preferably 10 minutes to 10 hours. It is not preferred that the substrate having low melting point or softening point such as a polymer film is subjected to a high temperature treatment because such a substrate tends to be deteriorated thereby. The heat treatment is preferably carried out at a temperature as low as possible, for example, 50 to 350° C., also from the viewpoint of cost. The semiconductor fine particle layer containing the smaller semiconductor fine particles having a size of 5 nm or less, a mineral acid, a metal oxide precursor, etc. can be heat-treated at such a low temperature. Further, the heat treatment may be carried out while applying ultraviolet ray, infrared ray, microwave, electric field, ultrasonic wave, etc. to the semiconductor fine particles, to reduce the heating temperature. To remove unnecessary organic compounds, etc., the heat treatment is preferably carried out in combination with evacuation, oxygen plasma treatment, washing by pure water, a solvent or a gas, etc.

After the heat treatment, the semiconductor fine particle layer may be subjected to a chemical metal-plating using an titanium tetrachloride aqueous solution, etc. or an electrochemical metal-plating using an titanium trichloride aqueous solution, etc., to increase the surface area of the semiconductor fine particles, or to enhance a purity of the particles, thereby improving the electron-injecting efficiency into the particles from the dye. Further, to prevent a reverse current from being provided from the semiconductor fine particles to the charge transfer layer, on the semiconductor fine particles is preferably adsorbed an organic compound having low electron conductivity. The organic compound preferably has a hydrophobic group.

It is preferable that the semiconductor fine particle layer has a large surface area to adsorb lots of dyes. The surface area of the semiconductor fine particle layer is preferably 10 times or more, more preferably 100 times or more of its projected area. The highest limit, even though it is not limited in particular, is generally a level of 1000 times.

(3) Dye

The dye used for the photosensitive layer is not particularly limited if it can absorb a light in visible region, near infrared region, etc. and can sensitize the semiconductor fine particle. The dye is preferably selected from the group consisting of metal complex dyes, methine dyes, porphyrin dyes and phthalocyanine dyes, and particularly preferably a metal complex dye. To make the photoelectric conversion wave range of the photoelectric conversion device larger, and to increase the photoelectric conversion efficiency, two or more kinds of the dyes are preferably used as a mixture or in combination thereof. In the case of using two or more kinds of the dyes, the kinds and the ratio of the dyes may be selected in accordance with the wave range and the strength distribution of the light source.

The dye preferably has an interlocking group, which can interact or adsorb to the surface of the semiconductor fine particles. Preferred interlocking groups include acidic groups such as —COOH, —OH, —$SO_3H$, —$P(O)(OH)_2$ and —$OP(O)(OH)_2$, and π-conductive chelating groups such as oxime group, dioxime group, hydroxyquinoline group, salicylate group and α-ketoenolate group. Among them, preferred are acidic groups, particularly preferred are —COOH, —$P(O)(OH)_2$ and —$OP(O)(OH)_2$. The interlocking group may form a salt with an alkaline metal, etc. or an intramolecular salt. In the polymethine dye, an acidic group such as squarylium ring group or croconium ring group formed by the methine chain may act as the interlocking group.

The preferred dyes used for the photosensitive layer will be specifically described below.

(a) Metal Complex Dye

The metal complex dye used in the present invention is preferably a metallophthalocyanine dye, a metal porphyrin dye or a ruthenium complex dye, particularly preferably a ruthenium complex dye. The ruthenium complex dyes described in U.S. Pat. Nos. 4,927,721, 4,684,537, 5,084,365, 5,350,644, 5,463,057 and 5,525,440, Japanese Patent Laid-Open Nos. 7-249790 and 2000-26487, Japanese Patent Publication No. 10-504512, WO 98/50393, etc. may be used in the present invention.

The ruthenium complex dye used in the present invention is preferably represented by the following general formula (III):

$$(A_1)_pRu(B\text{-}a)(B\text{-}b)(B\text{-}c) \qquad (III)$$

In the general formula (III), $A_1$ represents a monovalent or divalent ligand. $A_1$ is preferably selected from the group consisting of Cl, SCN, $H_2O$, Br, I, CN, NCO, SeCN, β-diketone derivatives, oxalic acid derivatives and dithiocarbamic acid derivatives. p is an integer of 0 to 3. B-a, B-b, and B-c independently represent an organic ligand represented by any of the following formulae B-1 to B-10.

B-1

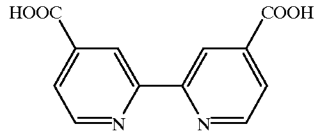

B-2

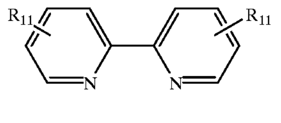

B-3

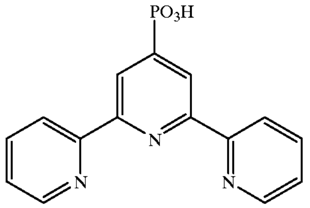

-continued

B-4

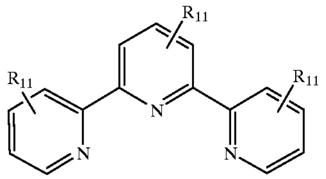

B-5

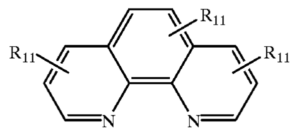

B-6

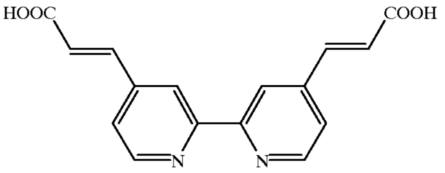

B-7

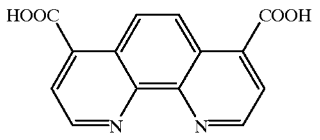

B-8

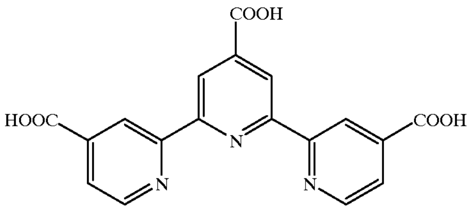

B-9

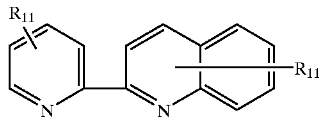

B-10

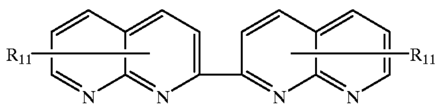

In the formulae B-1 to B-10, $R_{11}$, represents a hydrogen atom or a substituent. Specific examples of the substituent include: halogen atoms; substituted or unsubstituted alkyl groups having 1 to 12 carbon atom; substituted or unsubstituted aralkyl groups having 7 to 12 carbon atoms; substituted or unsubstituted aryl groups having 6 to 12 carbon atoms; acidic groups that may form a salt such as carboxyl group and phosphono group; chelating groups; etc. The alkyl group and the alkyl moiety of the aralkyl group may be straight or branched, and the aryl group and the aryl moiety of the aralkyl group may have a monocyclic structure or a polycyclic structure such as a condensed ring and a ring assemblage. B-a, B-b and B-c may be the same or different ligands, and the ruthenium complex dye represented by the general formula (I) may have only one or two of B-a, B-b and B-c.

The metal complex dyes preferably used in the present invention will be illustrated below without intention of restricting the scope of the present invention defined by the claims attached hereto.

$$(A_1)_pRu(B\text{-}a)(B\text{-}b)(B\text{-}c) \quad (III)$$

| | $A_1$ | p | B-a | B-b | B-c | $R_{11}$ |
|---|---|---|---|---|---|---|
| R-1 | SCN | 2 | B-1 | B-1 | — | — |
| R-2 | CN | 2 | B-1 | B-1 | — | — |
| R-3 | Cl | 2 | B-1 | B-1 | — | — |
| R-4 | CN | 2 | B-7 | B-7 | — | — |
| R-5 | SCN | 2 | B-7 | B-7 | — | — |
| R-6 | SCN | 2 | B-1 | B-2 | — | H |
| R-7 | SCN | 1 | B-1 | B-3 | — | — |
| R-8 | Cl | 1 | B-1 | B-4 | — | H |
| R-9 | I | 2 | B-1 | B-5 | — | H |
| R-10 | SCN | 3 | B-8 | — | — | — |
| R-11 | CN | 3 | B-8 | — | — | — |
| R-12 | SCN | 1 | B-2 | B-8 | — | H |
| R-13 | — | 0 | B-1 | B-1 | B-1 | — |

R-14

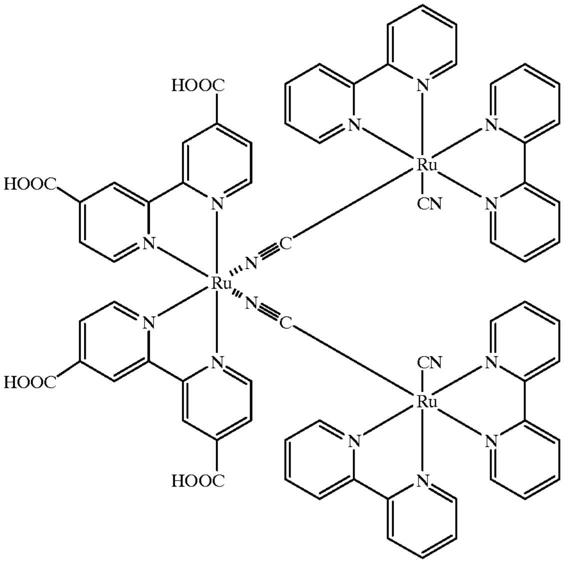

R-15

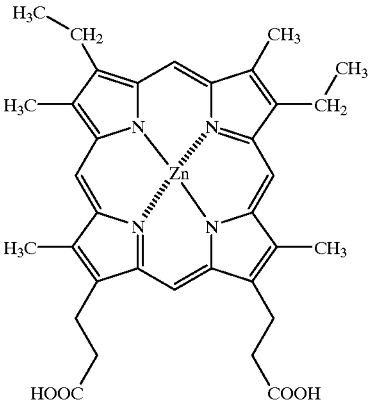

-continued

R-16

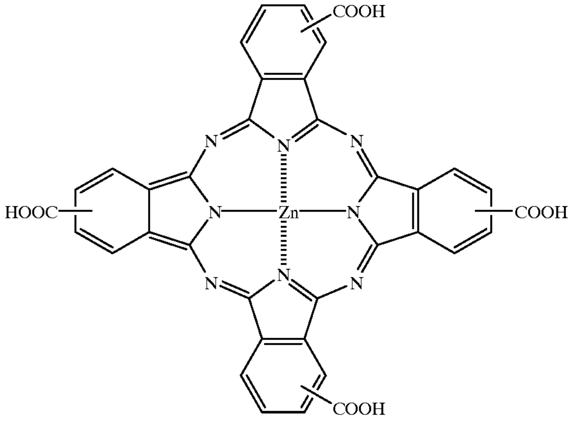

R-17

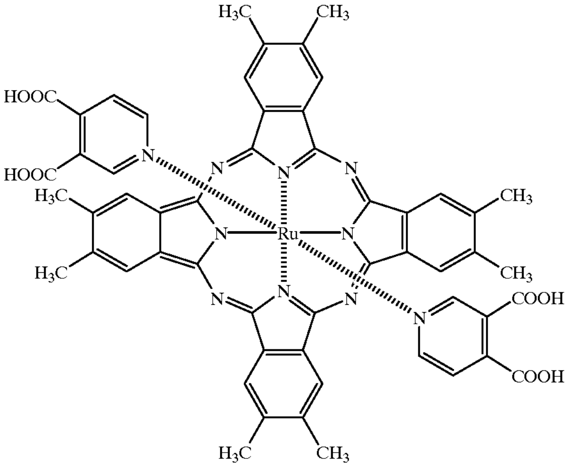

(b) Methine Dye

The methine dye used in the present invention is preferably a polymethine dye such as a cyanine dye, a merocyanine dye, a squalilium dye, etc. The polymethine dyes disclosed in Japanese Patent Laid-Open Nos. 11-35836, 11-67285, 11-86916, 11-97725, 11-158395, 11-163378, 11-214730, 11-214731, 11-238905 and 2000-26487, and European Patent Nos. 892411, 911841 and 991092 are preferably used in the present invention. Specific examples of the methine dye are shown below.

M-1

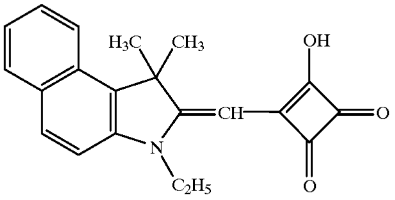

-continued

M-2

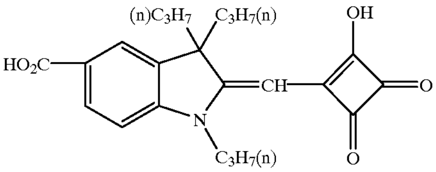

M-3

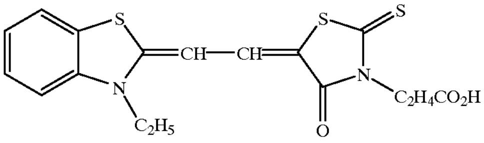

M-4

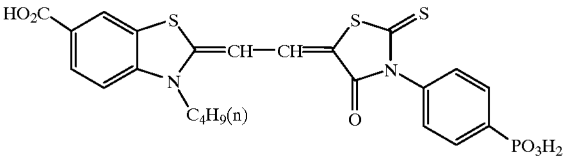

M-5

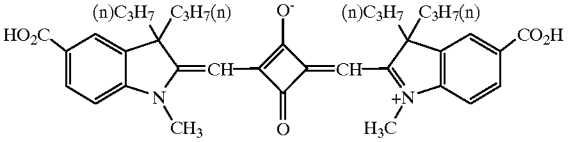

M-6

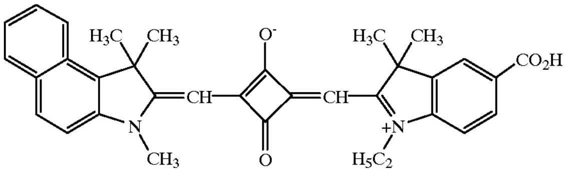

M-7

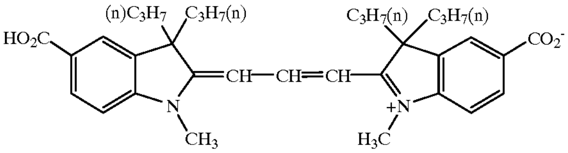

M-8

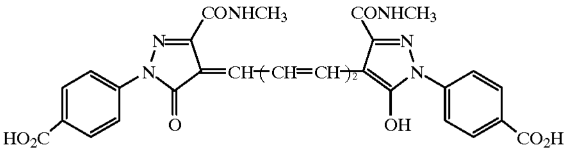

(4) Adsorption of Dye to Semiconductor Fine Particle

The dye may be adsorbed to the semiconductor fine particles by soaking the conductive support having the well-dried semiconductor fine particle layer in a dye adsorption solution, or by applying the dye adsorption solution to the semiconductor fine particle layer. In the former case, a soaking method, a dipping method, a roller method, an air-knife method, etc. may be used. In the soaking method, the dye may be adsorbed at a room temperature, or under reflux while heating as described in Japanese Patent Laid-Open No. 7-249790. As an applying method of the latter case, a wire-bar method, a slide-hopper method, an extrusion method, a curtain method, a spin method, a spray method, etc. may be used. Further, the dye may be applied to the semiconductor fine particle layer by an ink-jet method into an image, thereby providing a photoelectric conversion surface having a shape of the image. These methods can be used also in the case where the dye is adsorbed on the semiconductor fine particle while the semiconductor fine particle is treated with the compound (I) and/or (II), thus, the dye adsorption solution may contain the compound (I) and/or (II).

The dye unadsorbed on the semiconductor fine particle layer is preferably removed by washing immediately after the dye adsorption process. The washing is preferably carried out by a wet-type washing bath with a polar solvent such as acetonitrile or an organic solvent such as an alcohol solvent.

The total adsorption amount of the dye is preferably 0.01 to 100 mmol per the unit surface area (1 $m^2$) of the conductive support. The amount of the dye adsorbed on the semiconductor fine particles is preferably 0.01 to 1 mmol per 1 g of the semiconductor fine particles. Such an adsorption amount of the dye effects a sufficient sensitization to the semiconductors. Too small amount of the dye results in insufficient sensitization effect. On the other hand, if the amount of the dye is excessive, the dye unadsorbed on the semiconductor fine particles floats to reduce the sensitization effect.

To increase the adsorption amount of the dye, it is preferable that the semiconductor fine particle layer is subjected to a heat treatment before the dye is adsorbed thereon. After the heat treatment, it is preferable that the dye is quickly adsorbed on the semiconductor fine particle layer having a temperature of 60 to 150° C. before the layer is cooled to the room temperature, to prevent water from adsorbing onto the semiconductor fine particle layer.

(C) Charge Transfer Layer

The charge transfer layer replenishes electrons to the oxidized dye. The charge transfer layer may be composed of (i) an ion conductive electrolyte composition or (ii) a carrier-mediated, charge-transporting material utilizing charge transport mediated by a carrier in solid. Examples of (i) the ion conductive electrolyte composition include: molten salt electrolyte compositions containing a redox couple; electrolysis solutions where a redox couple is dissolved in a solvent; so-called gel electrolyte compositions where a solution including a redox couple is penetrated into a polymer matrix; solid electrolyte compositions; etc. Examples of (ii) the carrier-mediated, charge-transporting material include electron-transporting materials and hole-transporting materials. These materials may be used in combination with each other. The charge transfer layer used in this invention is preferably composed of the molten salt electrolyte composition or the electrolysis solution.

(1) Molten Salt Electrolyte Composition

The molten salt electrolyte compositions are particularly preferably used for the charge transfer layer from the viewpoint of improving the durability and the photoelectric conversion efficiency of the photoelectric conversion device. The molten salt electrolyte composition comprises a molten salt electrolyte having a low melting point. In the present invention, pyridinium salts, imidazolium salts, triazolium salts, etc. disclosed in WO 95/18456, Japanese Patent Laid-Open No. 8-259543, "Denki Kagaku (Electrochemistry)", 65, 11, 923 (1997), etc. may be used as the molten salt electrolyte. The molten salt electrolyte preferably has the melting point of 100° C. or less, and it is particularly preferably liquid at the room temperature.

The molten salt electrolytes represented by any of the following general formulae (Y-a), (Y-b) and (Y-c) can be preferably used in the present invention.

(Y-a)

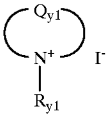

(Y-b)

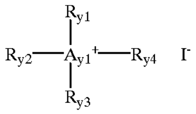

(Y-c)

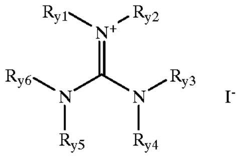

In the general formula (Y-a), $Q_{y1}$ represents an atomic group forming an aromatic cation having a 5- or 6-membered ring structure with the nitrogen atom. $Q_{y1}$ is preferably composed of atoms selected from the group consisting of carbon, hydrogen, nitrogen, oxygen and sulfur atoms. The 5-membered ring formed by $Q_{y1}$ is preferably oxazole ring, thiazole ring, imidazole ring, pyrazole it ring, iso-oxazole ring, thiadiazole ring, oxadiazole ring, triazole ring, indole ring or pyrrole ring, more preferably oxazole ring, thiazole ring or imidazole ring, particularly preferably oxazole ring or imidazole ring. The 6-membered ring formed by $Q_{y1}$ is preferably pyridine ring, pyrimidine ring, pyridazine ring, pyrazine ring or triazine ring, more preferably pyridine ring.

In the general formula (Y-b), $A_{y1}$, represents a nitrogen atom or a phosphorus atom.

$R_{y1}$ to $R_{y6}$ in the general formulae (Y-a), (Y-b) and (Y-c) independently represent: a substituted or unsubstituted alkyl group preferably having 1 to 24 carbon atom, which may be straight, branched or cyclic, such as methyl group, ethyl group, propyl group, isopropyl group, pentyl group, hexyl group, octyl group, 2-ethylhexyl group, t-octyl group, decyl group, dodecyl group, tetradecyl group, 2-hexyldecyl group, octadecyl group, cyclohexyl group, cyclopentyl group, etc.; or a substituted or unsubstituted alkenyl group preferably having 2 to 24 carbon atoms, which may be straight or branched, such as vinyl group, allyl group, etc. $R_{y1}$ to $R_{y6}$ is more preferably an alkyl group having 2 to 18 carbon atoms or an alkenyl group having 2 to 18 carbon atoms, particularly preferably an alkyl group having 2 to 6 carbon atoms, respectively.

Two or more of $R_{y1}$ to $R_{y4}$ in the general formula (Y-b) may be bonded together to form a non-aromatic ring containing $A_{y1}$. Two or more of $R_{y1}$ to $R_{y6}$ in the general formula (Y-c) may be bonded together to form a ring.

$Q_{y1}$ and $R_{y1}$ to $R_{y6}$ in the general formulae (Y-a), (Y-b) and (Y-c) may have a substituent, respectively. Preferable examples of the substituent include: halogen atoms such as F, Cl, Br and I; cyano group; alkoxy groups such as methoxy group, ethoxy group, methoxyethoxy group and methoxyethoxyethoxy group; aryloxy groups such as phenoxy group; alkylthio groups such as methylthio group and ethylthio group; alkoxycarbonyl groups such as ethoxycarbonyl group; carbonate groups such as ethoxycarbonyloxy group; acyl groups such as acetyl group, propionyl group and benzoyl group; sulfonyl groups such as methane sulfonyl group and benzene sulfonyl group; acyloxy groups such as acetoxy group and benzoyloxy group; sulfonyloxy groups such as methane sulfonyloxy group and toluene sulfonyloxy group; phosphonyl groups such as a diethylphosphonyl group; amido groups such as acetylamino group and benzoylamino group; carbamoyl groups such as N,N-dimethylcarbamoyl group; alkyl groups such as methyl group, ethyl group, propyl group, isopropyl group, cyclopropyl group, butyl group, 2-carboxyethyl group and benzyl group; aryl groups such as phenyl group and toluyl group; heterocyclic groups such as pyridyl group, imidazolyl group and furanyl group; alkenyl groups such as vinyl group and 1-propenyl group; silyl groups; silyloxy groups; etc.

The molten salt electrolytes represented by the general formula (Y-a), (Y-b) or (Y-c) may form an oligomer or a polymer through $Q_{y1}$ or $R_{y1}$ to $R_{y6}$.

The molten salt electrolytes may be used singly or in combination with each other. Further, $I^-$ of the molten salt electrolytes represented by the general formula (Y-a), (Y-b) or (Y-c) may be replaced into the other anion. The other anion is preferably a halide ion such as $Cl^-$ and $Br^-$, $SCN^-$, $BF_4^-$, $PF_6^-$, $ClO_4^-$, $N^-(SO_2CF_3)_2$, $N^-(SO_2CF_2CF_3)_2$, $CH_3SO_3^-$, $CF_3SO_3^-$, $CF_3COO^-$, $BPh_4^-$, $C^-(SO_2CF_3)_3$, etc., more preferably $SCN^-$, $BF_4^-$, $N^-(SO_2CF_3)_2$, $CF_3SO_3^-$ or $CF_3COO^-$. Also, the molten salt electrolyte represented by the general formula (Y-a), (Y-b) or (Y-c) may be used in combination with another iodine salt such as LiI or an alkali metal salt such as $CF_3COOLi$, $CF_3COONa$, LiSCN and NaSCN. Weight ratio of the alkali metal salt is preferably 0.02 to 2 weight %, more preferably 0.1 to 1 weight %, to 100 weight % of the molten salt electrolyte composition.

The molten salt electrolytes preferably used in the present invention will be illustrated below without intention of restricting the scope of the present invention defined by the claims attached hereto.

(Y1)

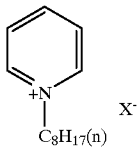

Y1-1 X = I
Y1-2 X = $BF_4$
Y1-3 X = $N(SO_2CF_3)_2$
Y1-4 X = $PF_6$ (Y2)

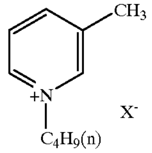

Y2-1 X = I
Y2-2 X = $BF_4$
Y2-3 X = $N(SO_2CF_3)_2$
Y2-4 X = $CF_3COO$
Y2-5 X = SCN
Y2-6 X = $CF_3SO_3$

-continued (Y3)

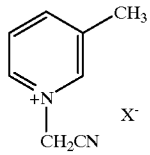

Y3-1 X = I
Y3-2 X = $BF_4$
Y3-3 X = $N(SO_2CF_3)_2$ (Y4)

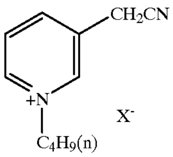

Y4-1 X = I
Y4-2 X = $BF_4$
Y4-3 X = $N(SO_2CF_3)_2$ (Y5)

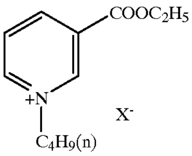

Y5-1 X = I
Y5-2 X = $BF_4$
Y5-3 X = $N(SO_2CF_3)_2$ (Y6)

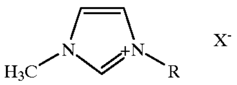

Y6-1 X = I, R = Et
Y6-2 X = $BF_4$, R = Et
Y6-3 X = $N(SO_2CF_3)_2$, R = Et
Y6-4 X = Br, R = Et
Y6-5 X = $CF_3COO$, R = Et
Y6-6 X = SCN, R = Et
Y6-7 X = $CF_3SO_3$, R = Et
Y6-8 X = I, R = $^nPr$
Y6-9 X = $BF_4$, R = $^nPr$
Y6-10 X = $N(SO_2CF_3)_2$, R = $^nPr$
Y6-11 X = I, R = $^nBu$
Y6-12 X = $BF_4$, R = $^nBu$
Y6-13 X = $N(SO_2CF_3)_2$, R = $^nBu$ (Y7)

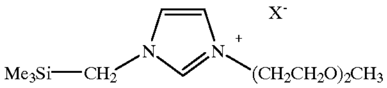

Y7-1 X = I
Y7-2 X = $BF_4$
Y7-3 X = $N(SO_2CF_3)_2$
Y7-4 X = $CF_3COO$
Y7-5 X = SCN (Y8)

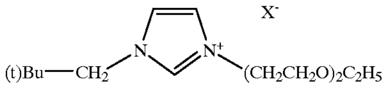

Y8-1 X = I
Y8-2 X = $BF_4$
Y8-3 X = $N(SO_2CF_3)_2$
Y8-4 X = $PF_6$
Y8-5 X = $CF_3COO$
Y8-6 X = SCN
Y8-7 X = $CF_3SO_3$

-continued (Y9)

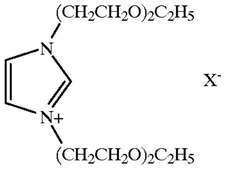

Y9-1 X = I
Y9-2 X = $BF_4$
Y9-3 X = $N(SO_2CF_3)_2$
Y9-4 X = $CF_3COO$
Y9-5 X = SCN
Y9-6 X = $CF_3SO_3$ (Y10)

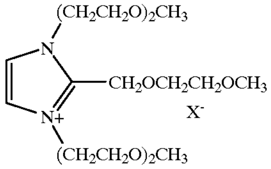

Y10-1 X = I
Y10-2 X = $BF_4$
Y10-3 X = $N(SO_2CF_3)_2$ (Y11)

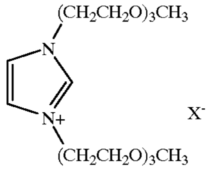

Y11-1 X = I
Y11-2 X = $BF_4$
Y11-3 X = $N(SO_2CF_3)_2$ (Y12)

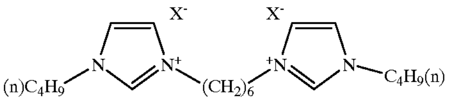

Y12-1 X = I
Y12-2 X = $BF_4$
Y12-3 X = $N(SO_2CF_3)_2$ (Y13)

Y13-1 X = I
Y13-2 X = $BF_4$
Y13-3 X = $N(SO_2CF_3)_2$ (Y14)

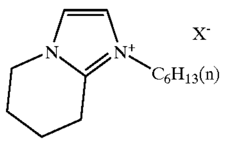

Y14-1 X = I
Y14-2 X = $BF_4$
Y14-3 X = $N(SO_2CF_3)_2$

-continued (Y15)

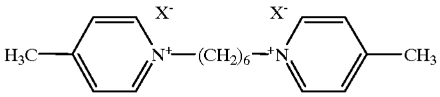

Y15-1 X = I
Y15-2 X = $BF_4$
Y15-3 X = $N(SO_2CF_3)_2$ (Y16)

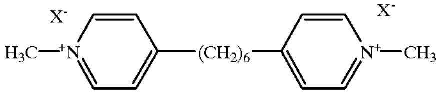

Y16-1 X = I
Y16-2 X = $BF_4$
Y16-3 X = $N(SO_2CF_3)_2$ (Y17)

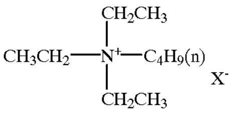

Y17-1 X = I
Y17-2 X = $BF_4$
Y17-3 X = $N(SO_2CF_3)_2$
Y17-4 X = $PF_6$ (Y18)

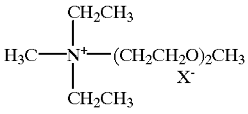

Y18-1 X = I
Y18-2 X = $BF_4$
Y18-3 X = $N(SO_2CF_3)_2$ (Y19)

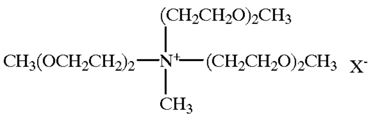

Y19-1 X = I
Y19-2 X = $BF_4$
Y19-3 X = $N(SO_2CF_3)_2$
Y19-4 X = $CF_3COO$
Y19-5 X = SCN
Y19-6 X = $CF_3SO_3$ (Y20)

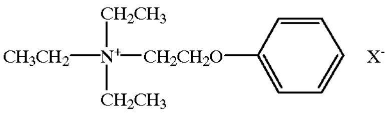

Y20-1 X = I
Y20-2 X = $BF_4$
Y20-3 X = $N(SO_2CF_3)_2$ (Y21)

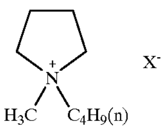

Y21-1 X = I
Y21-2 X = $BF_4$
Y21-3 X = $N(SO_2CF_3)_2$

-continued (Y22)

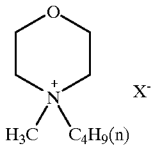

Y22-1 X = I
Y22-2 X = $BF_4$
Y22-3 X = $N(SO_2CF_3)_2$ (Y23)

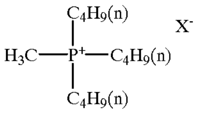

Y23-1 X = I
Y23-2 X = $BF_4$
Y23-3 X = $N(SO_2CF_3)_2$ (Y24)

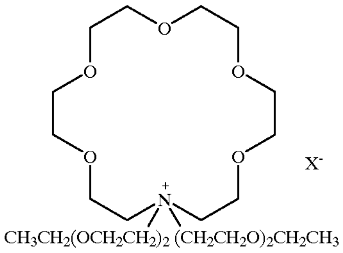

Y24-1 X = I
Y24-2 X = $BF_4$
Y24-3 X = $N(SO_2CF_3)_2$ (Y25)

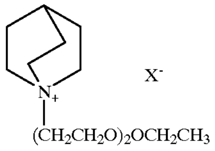

Y25-1 X = I
Y25-2 X = $BF_4$
Y25-3 X = $N(SO_2CF_3)_2$ (Y26)

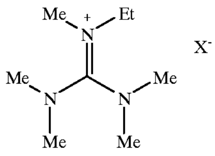

Y26-1 X = I
Y26-2 X = $N(SO_2CF_3)_2$
Y26-3 X = $BF_4$
Y26-4 X = $PF_6$ (Y27)

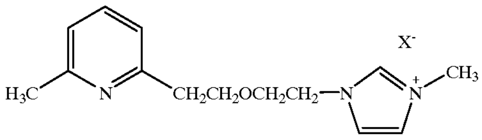

Y27-1 X = I
Y27-2 X = $N(SO_2CF_3)_2$
Y27-3 X = $BF_4$
Y27-4 X = $CF_3COO$
Y27-5 X = SCN
Y27-6 X = $CF_3SO_3$

-continued (Y28)

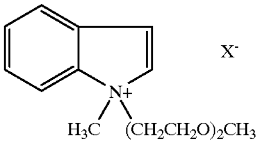

Y28-1 X = I

Y28-2 X = $BF_4$

Y28-3 X = $N(SO_2CF_3)_2$ (Y29)

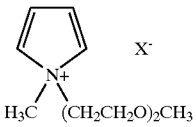

Y29-1 X = I

Y29-2 X = $BF_4$

Y29-3 X = $N(SO_2CF_3)_2$

Though the molten salt electrolyte composition may comprise a solvent described below, it particularly preferably comprises no solvent. The content of the molten salt electrolyte is preferably 50 weight % or more, particularly preferably 90 weight % or more, based on the entire composition. The weight ratio of the iodine salts contained in the molten salt electrolyte composition is It preferably 50 weight % or more to the entire salts contained therein.

The molten salt electrolyte composition preferably comprises iodine. The iodine-content is preferably 0.1 to 20 weight %, more preferably 0.5 to 5 weight % based on the entire composition.

(2) Electrolysis Solution

The electrolysis solution used in the present invention is preferably composed of an electrolyte, a solvent and an additive. The electrolyte may be: a combination of $I_2$ and an iodide (a metal iodide such as LiI, NaI, KI, CsI and $CaI_2$, a quaternary ammonium iodide such as a tetralkylammonium iodide, pyridinium iodide and imidazolium iodide, etc.); a combination of $Br_2$ and a bromide (a metal bromide such as LiBr, NaBr, KiBr, CsBr and $CaBr_2$, a quaternary ammonium bromide such as a tetralkylammonium bromide and pyridinium bromide, etc.); a metal complex such as a ferrocyanide-ferricyanide and a ferrocene-ferricinium ion; a sulfur compound such as sodium polysulfide and alkylthiol-alkyldisulfide; a viologen dye; hydroquinone-quinone; etc. Among them, preferred is a combination of $I_2$ and LiI or the quaternary ammonium iodide. A plurality of the electrolytes may be mixed to be in use.

The concentration of the electrolyte in the electrolysis solution is preferably 0.1 to 10 M, more preferably 0.2 to 4 M. Further, the electrolysis solution may comprise iodine, and the concentration of iodine therein is preferably 0.01 to 0.5 M.

The solvent used for the electrolysis solution is preferably such that has a low viscosity and a high ionic mobility, or that has a high permittivity and can increase the actual carrier concentration of the electrolysis solution, to exhibit an excellent ionic conductibility. Examples of the solvent include: carbonates such as ethylene carbonate and propylene carbonate; heterocyclic compounds such as 3-methyl-2-oxazolidinone; ethers such as dioxan and diethyl ether; chain ethers such as ethyleneglycol dialkylethers, propyleneglycol dialkylethers, polyethyleneglycol dialkylethers and polypropyleneglycol dialkylethers; alcohols such as methanol, ethanol, ethyleneglycol monoalkylethers, propyleneglycol monoalkylethers, polyethyleneglycol monoalkylethers and polypropyleneglycol monoalkylethers; glycols such as ethylene glycol, propylene glycol, polyethylene glycol, polypropylene glycol and glycerin; nitrile compounds such as acetonitrile, glutarodinitrile, methoxyacetonitrile, propionitrile and benzonitrile; aprotic polar solvents such as dimethylsulfoxide (DMSO) and sulfolane; water; etc. These solvents may be used in combination with each other.

Further, to the above-mentioned molten salt electrolyte composition and the electrolysis solution is preferably added a basic compound such as t-butylpyridine, 2-picoline, 2,6-lutidine, etc., as described in J. Am. Ceram. Soc., 80 (12), 3157 to 3171 (1997). The concentration of the basic compound therein is preferably 0.05 to 2 M.

(3) Gel Electrolyte Composition

The molten salt electrolyte composition, the electrolysis solution, etc. mentioned above may be gelled or solidified to prepare the gel electrolyte composition. Gelation may be achieved by: adding a polymer; adding an oil-gelling agent; polymerization of monomers including a multifunctional monomer; a crosslinking reaction of a polymer; etc.

In the case where the gel electrolyte composition is prepared by adding a polymer, compounds described in "Polymer Electrolyte Reviews 1 and 2" edited by J. R. MacCallum and C. A. Vincent, ELSEIVER APPLIED SCIENCE may be used as the polymer. Of the compounds, polyacrylonitrile and poly(vinylidene fluoride) are preferred.

In the case where the gel electrolyte composition is prepared by adding an oil-gelling agent, compounds described in J. Chem. Soc. Japan, Ind. Chem. Soc., 46, 779 (1943), J. Am. Chem. Soc., 111, 5542 (1989), J. Chem. Soc., Chem. Commun., 390 (1993), Angew. Chem. Int. Ed. Engl., 35, 1949 (1996), Chem. Lett., 885 (1996), J. Chem. Soc., Chem. Commun., 545 (1997), etc. may be used as the oil-gelling agent. Of the compounds, preferred are those having amide structure.

In the case where the gel electrolyte composition is prepared by a cross-linking reaction of a polymer, it is preferable that a polymer containing a group having cross-linking reactivity is used in combination with a crosslinking agent. The group having the cross-linking reactivity is preferably amino group or a nitrogen-containing heterocyclic group such as pyridyl group, imidazolyl group, thiazolyl group, oxazolyl group, triazolyl group, morpholyl group, piperidyl group, piperazyl group, etc. The cross-linking agent is preferably an electrophilic agent having a plurality of functional group that can be attacked by the nitrogen atom, for example, multi-functional alkyl halides, aralkyl halides, sulfonates, acid anhydrides, acyl chlorides, isocyanates, α,β-unsaturated sulfonyl compounds, α,β-unsaturated carbonyl compounds, α,β-unsaturated nitrile compounds, etc. Cross-linking methods disclosed in Japanese Patent Laid-Open Nos. 2000-17076 and 2000-86724 may be used in the present invention.

Further, a method for gelling an electrolysis solution disclosed in Japanese Patent Laid-Open No. 11-185863 and a method for gelling a molten salt electrolyte composition disclosed in Japanese Patent Laid-Open No. 2000-58140 may be used in this invention.

(4) Hole-Transporting Material

In the present invention, an organic solid hole-transporting material, an inorganic solid hole-transporting material or a combination thereof may be used for the charge transfer layer instead of the ion conductive electrolyte composition such as the molten salt electrolyte composition.

(a) Organic Hole-Transporting Material

Preferred examples of the organic hole-transporting material used in this invention include: aromatic amines disclosed in J. Hagen, et al., Synthetic Metal, 89, 215 to 220 (1997), Nature, Vol. 395, Oct. 8, 1998, Page 583 to 585, WO 97/10617, U.S. Pat. Nos. 4,923,774 and 4,764,625, Japanese Patent Laid-Open Nos. 59-194393, 5-234681, 4-308688, 3-269084, 4-129271, 4-175395, 4-264189, 4-290851, 4-364153, 5-25473, 5-239455, 5-320634, 6-1972, 7-138562, 7-252474 and 11-144773, etc.; triphenylenes disclosed in Japanese Patent Laid-Open Nos. 11-149821, 11-148067 and 11-176489, etc.; oligothiophene compounds disclosed in Adv. Mater., 9, No. 7, 557, 1997, Angew. Chem. Int. Ed. Engl., 34, 3, 303 to 307, 1995, J. Am. Chem. Soc., Vol. 120, No. 4, Page 664 to 672, 1998, etc.; and conductive polymers such as polypyrrole disclosed in K. Murakoshi, et al., Chem. Lett., 471, 1997 and polyacetylene, poly(p-phenylene), poly (p-phenylenevinylene), polythienylenevinylene, polythiophene, polyaniline, polytoluidine and derivatives thereof disclosed in "Handbook of Organic Conductive Molecules and Polymers", Vols. 1 to 4, edited by NALWA, published by WILEY.

As described in Nature, Vol. 395, 8 Oct. 583 to 585 (1998), to the organic hole-transporting material may be added a compound having cation radical such as tris(4-bromophenyl)aminium hexachloroantimonate to control the dopant level, or a salt such as $Li[(CF_3SO_2)_2N]$ to achieve potential-control of surface of the semiconductor, thereby compensating a space-charge layer.

(b) Inorganic Hole-Transporting Material

The inorganic hole-transporting material may be a p-type inorganic compound semiconductor. Band gap of the p-type inorganic compound semiconductor is preferably 2 eV or more, more preferably 2.5 eV or more. Ionization potential of the p-type inorganic compound semiconductor should be smaller than that of the photosensitive layer to reduce holes of the dye. Although the ionization potential of the p-type inorganic compound semiconductor may be selected depending on the kind of the dye, generally, it is preferably 4.5 to 5.5 eV, more preferably 4.7 to 5.3 eV. The p-type inorganic compound semiconductor is preferably a compound having a monovalent copper such as CuI, CuSCN, $CuInSe_2$, $Cu(In,Ga)Se_2$, $CuGaSe_2$, $Cu_2O$, CuS, $CuGaS_2$, $CuInS_2$, $CuAlSe_2$, etc. Among them, CuI and CuSCN are preferred, and CuI is the most preferred. GaP, NiO, CoO, FeO, $Bi_2O_3$, $MoO_2$, $Cr_2O_3$, etc. are also used as the p-type inorganic compound semiconductor.

(5) Method for Forming Charge Transfer Layer

The charge transfer layer may be provided by any of the following two methods. One is a method where the counter electrode is stuck on the photosensitive layer beforehand and the material for the charge transfer layer in the liquid state is made to penetrate a gap therebetween. Another is a method where the charge transfer layer is directly disposed on the photosensitive layer, the counter electrode being then disposed thereon.

In the former method, the material for the charge transfer layer may be made to penetrate the gap by a normal pressure process utilizing capillarity, or by a reduced pressure process where the material is pumped up from the gap to replace gas phase therein with liquid phase.

In the case of providing a wet charge transfer layer by the latter method, the wet charge transfer layer is applied to the photosensitive layer, the counter electrode is disposed on the wet charge transfer layer without drying it and edges thereof is subjected to a treatment for preventing liquid-leakage, if necessary. In the case of providing a gel charge transfer layer by the latter method, the charge transfer material may be applied in the liquid state and gelled by polymerization, etc. In this case, the counter electrode may be disposed on the charge transfer layer before or after drying and fixing the charge transfer layer.

The charge transfer layer composed of the electrolysis solution, the wet organic hole-transporting material, the gel electrolyte composition, etc. may be disposed by a method, a roller method, a dip method, an air-knife method, an extrusion method, a slide-hopper method, a wire-bar method, a spin method, a spray method, a cast method, various printing methods, etc. similarly to the case of forming the semiconductor fine particle layer, or adsorbing a dye to the semiconductor mentioned above.

The charge transfer layer composed of the solid electrolyte, the solid hole transporting material, etc. may be formed by a dry film-forming method such as a vacuum deposition method and a CVD method, and followed by disposing the counter electrode thereon. The organic hole-transporting material may be made to penetrate into the photosensitive layer by a vacuum deposition method, a cast method, a coating method, a spin-coating method, a soaking method, an electrolytic polymerization method, a photo-polymerization method, etc. The inorganic hole-transporting material may be made to penetrate into the photosensitive layer by a cast method, a coating method, a spin-coating method, a soaking method, an electrolytic deposition method, an electroless deposition method, etc.

(D) Counter Electrode

The counter electrode is the counter electrically conductive layer, which is supported by the substrate, if necessary. Examples of the electrically conductive material used for the counter electrically conductive layer include: metals such as platinum, gold, silver, copper, aluminum, magnesium and indium; carbon; and electrically conductive metal oxides such as indium-tin composite oxides and fluorine-doped tin oxides. Among them, preferred are platinum, gold, silver, copper, aluminum and magnesium. The substrate of the counter electrode is preferably made of a glass or a plastic to be coated or vapor-deposited with the electrically conductive material. The counter electrically conductive layer preferably has a thickness of 3 nm to 10 $\mu$m, although the thickness is not particularly limited. The surface resistance of the counter electrically conductive layer is desirably as low as possible. The surface resistance is preferably 50 $\Omega$/square or less, more preferably 20 $\Omega$/square or less.

Light may be irradiated from any one or both side of the conductive support and the counter electrode, so that at least one of them should be substantially transparent to have light reached to the photosensitive layer. From a viewpoint of improving electric generation efficiency, it is preferable that the conductive support is substantially transparent to irradiate light therethrough. In this case, the counter electrode preferably has a light-reflective property. Such a counter electrode may be composed of a glass or a plastic having a vapor-deposited layer of metal or electrically conductive oxide, or metal thin film.

The counter electrode may be disposed by applying, metal-plating or vapor-depositing (PVD, CVD, etc.) the electrically conductive material directly onto the charge transfer layer. It is preferable that the metal lead is used to reduce the resistance of the counter electrode, as is similar to the conductive support. The metal lead is particularly preferably used for the transparent counter electrode. Preferable embodiments of the metal lead used for the counter electrode are the same as those of the metal lead used for the conductive support mentioned above.

(E) Others

It is preferable that a fine semiconductor thin film is provided between the conductive support and the photosensitive layer as an undercoating layer to prevent short-circuit of the counter electrode and the conductive support, particularly in the case of the charge transfer layer composed of the electron-transporting material or the hole-transporting material. The undercoating layer is preferably made of $TiO_2$, $SnO_2$, $Fe_2O_3$, $WO_3$, ZnO or $Nb_2O_5$, more preferably made of $TiO_2$. The undercoating layer may be disposed by a spray-pyrolysis method described in Electrochim. Acta, 40, 643 to 652 (1995), a sputtering method, etc. The thickness of the undercoating layer is preferably 5 to 1000 nm, more preferably 10 to 500 nm.

Functional layers such as a protective layer and a reflection-preventing it: layer may be disposed on any one or both of the conductive support and the counter electrode. The functional layers may be disposed by a method selected in accordance with the materials therefor, such as a coating method, a vapor-deposition method and a sticking method.

(F) Interior Structure of Photoelectric Conversion Device

As described above, the photoelectric conversion device may have various interior structures in accordance with an end of use. The structures are classified into two major forms, a structure allowing light incidence from both faces, and a structure allowing it from only one face. Each of FIGS. 2 to 9 illustrates an example of the interior structure of the photoelectric conversion device, which is preferable in the present invention.

Figure 2:
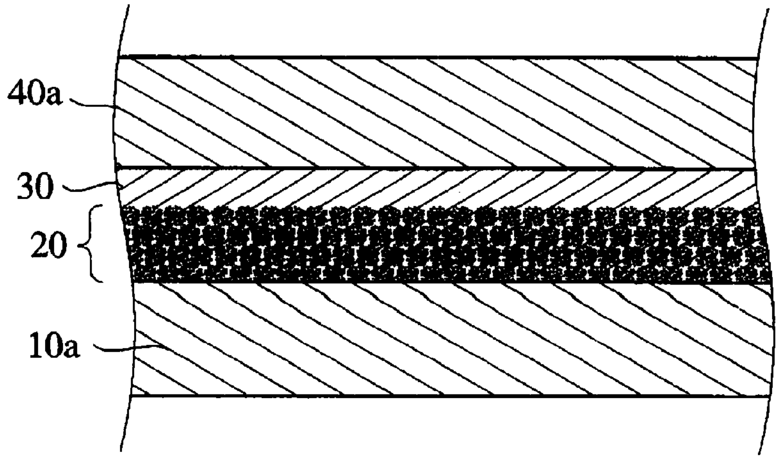
FIG. 2 is a partial cross sectional view showing a preferable structure of a photoelectric conversion device of the present invention.

As for the structure illustrated in FIG. 2, the photosensitive layer 20 and the charge transfer layer 30 are disposed between the transparent electrically conductive layer 10*a* and the transparent counter electrically conductive layer 40*a*. This structure allows light incidence from both faces of the device.

Figure 3:
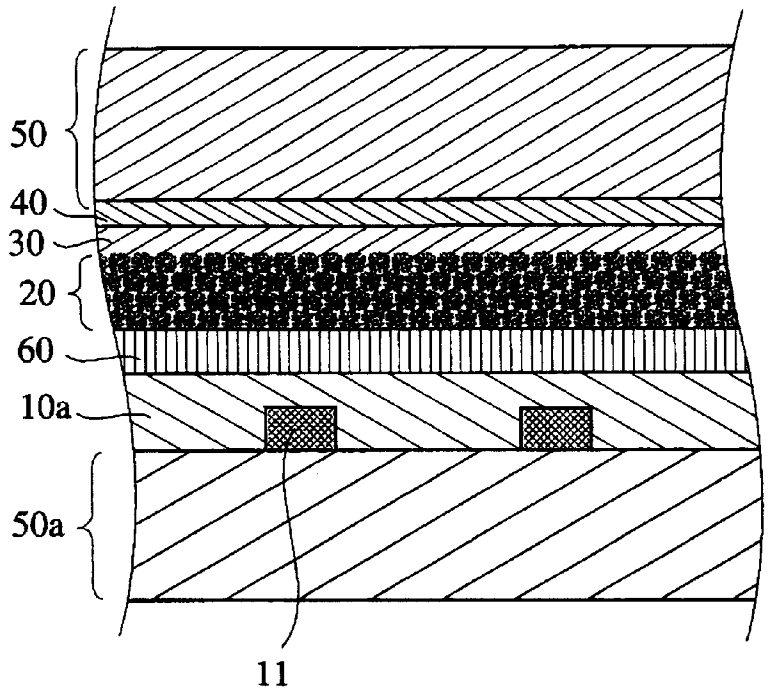
FIG. 3 is a partial cross sectional view showing a preferable structure of a photoelectric conversion device of the present invention.

As for the structure illustrated in FIG. 3, on the transparent substrate 50*a* partially having the metal lead 11 is disposed the transparent electrically conductive layer 10*a*, the undercoating layer 60, the photosensitive layer 20, the charge transfer layer 30 and the counter electrically conductive layer 40 are laminated in this order, and the substrate 50 is further placed thereon. This structure allows light incidence from the electrically conductive layer side.

Figure 4:
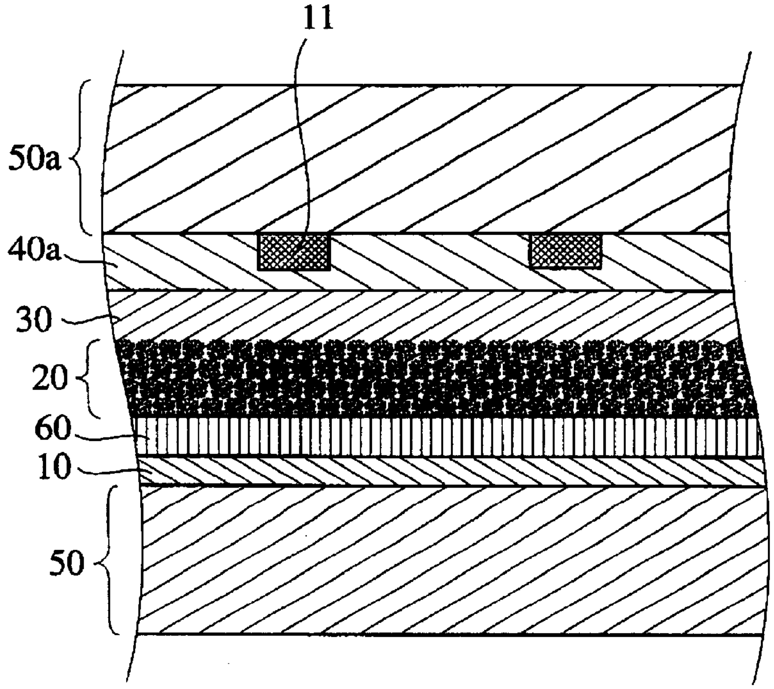
FIG. 4 is a partial cross sectional view showing a preferable structure of a photoelectric conversion device of the present invention.

As for the structure illustrated in FIG. 4, the photosensitive layer 20 is disposed on the substrate 50 having the electrically conductive layer 10 through the undercoating layer 60, the charge transfer layer 30 and the transparent counter electrically conductive layer 40*a* are disposed thereon, and further the transparent substrate 50*a* locally having the metal lead 11 is placed on the counter electrically conductive layer 40*a* so that the metal lead 11 side orients inward. This structure allows light incidence from the counter electrode side.

Figure 5:
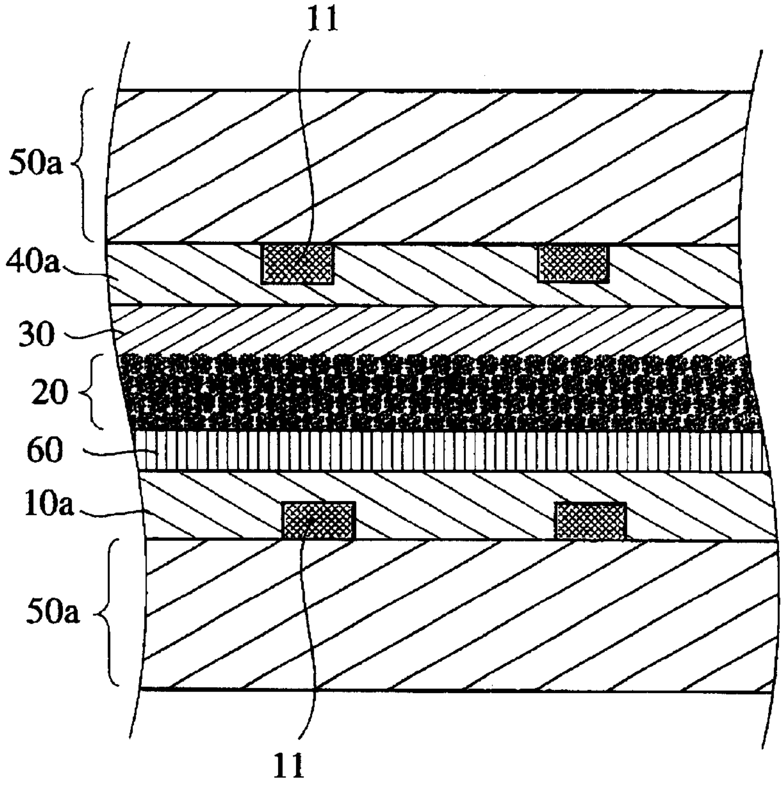
FIG. 5 is a partial cross sectional view showing a preferable structure of a photoelectric conversion device of the present invention.

As for the structure illustrated in FIG. 5, on the two transparent substrates 50*a* each having the metal lead 11 partially are formed the transparent electrically conductive layer 10*a* and the transparent counter electrically conductive layer 40*a*, respectively, and the undercoating layer 60, the photosensitive layer 20 and the charge transfer layer 30 placed between the conductive layers. This structure allows light incidence from both faces of the photoelectric conversion device.

Figure 6:
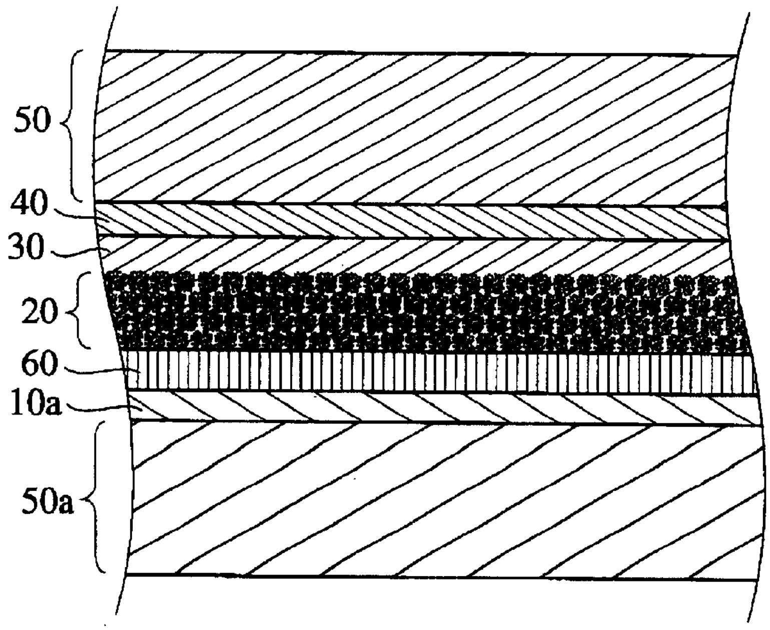
FIG. 6 is a partial cross sectional view showing a preferable structure of a photoelectric conversion device of the present invention.

As for the structure illustrated in FIG. 6, on the transparent substrate 50*a* having the transparent electrically conductive layer 10*a* is disposed the photosensitive layer 20 through the undercoating layer 60, the charge transfer layer 30 and the counter electrically conductive layer 40 are formed thereon, and further the substrate 50 is placed on the counter electrically conductive layer 40. This structure allows light incidence from the electrically conductive layer side.

Figure 7:
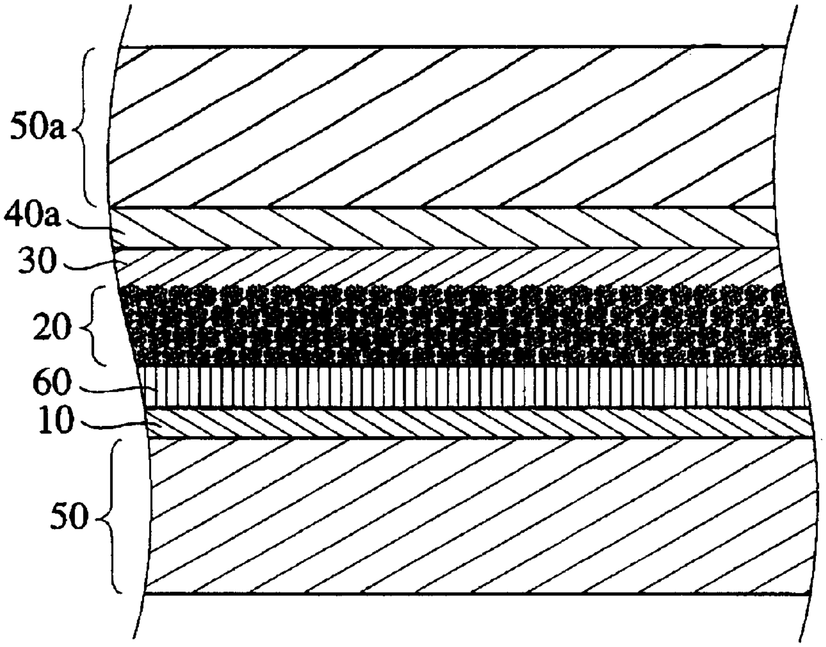
FIG. 7 is a partial cross sectional view showing a preferable structure of a photoelectric conversion device of the present invention.

As for the structure illustrated in FIG. 7, on the substrate 50 having the electrically conductive layer 10 is disposed the photosensitive layer 20 through the undercoating layer 60, the charge transfer layer 30 and the transparent counter electrically conductive layer 40*a* are formed thereon, and further the transparent substrate 50*a* is placed on the layer 40*a*. This structure allows light incidence from the counter electrode side.

Figure 8:
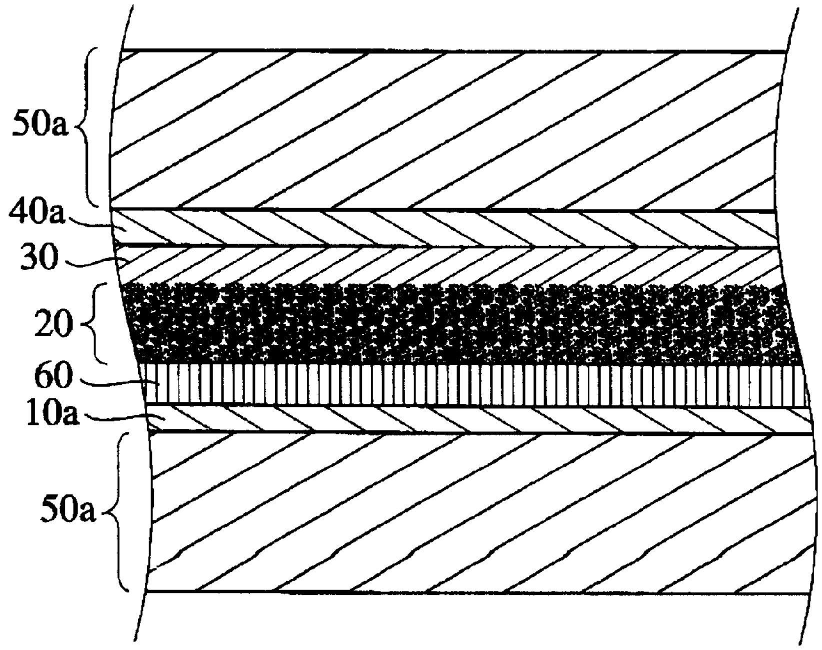
FIG. 8 is a partial cross sectional view showing a preferable structure of a photoelectric conversion device of the present invention.

As for the structure illustrated in FIG. 8, on the transparent substrate 50*a* having the transparent electrically conductive layer 10*a* is disposed the photosensitive layer 20 through the undercoating layer 60, the charge transfer layer 30 and the transparent counter electrically conductive layer 40*a* are formed thereon, and further the transparent substrate 50*a* is placed on the layer 40*a*. This structure allows light incidence from both faces of the photoelectric conversion device.

Figure 9:
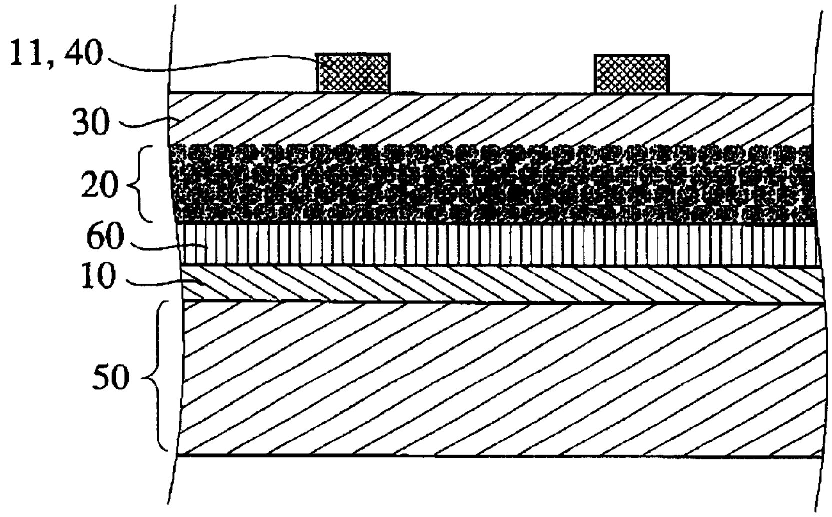
FIG. 9 is a partial cross sectional view showing a preferable structure of a photoelectric conversion device of the present invention.

As for the structure illustrated in FIG. 9, the photosensitive layer 20 is disposed on the substrate 50 having the electrically conductive layer 10 through the undercoating layer 60, the solid charge transfer layer 30 is disposed thereon, and further the counter electrically conductive layer 40 or the metal lead 11 is locally placed on the solid charge transfer layer 30. This structure allows light incidence from the counter electrode side.

[V] Photoelectric Cell

The photoelectric cell of the present invention is constituted by connecting the photoelectric conversion device of the present invention to an external circuit to electrically work or generate electricity in the external circuit. Such a photoelectric cell that has the charge transfer layer composed of ion conductive electrolyte composition is referred to as a photo-electrochemical cell. A photoelectric cell intended for power generation using solar light is referred to as a solar cell.

The side face of the photoelectric cell is preferably sealed with a polymer or an adhesive agent, etc. to prevent deterioration and volatility of the content in the cell. The external circuit is connected to the conductive support and the counter electrode via a lead. Various known circuits may be used in the present invention.

In the case where the photoelectric conversion device of the present invention is applied to the solar cell, the interior structure of the solar cell may be essentially the same as that of the photoelectric conversion device mentioned above. The solar cell comprising the photoelectric conversion device of the present invention may have a known module structure. In general module structure of the solar cell, cells are placed on a substrate of metal, ceramic, etc. and covered with a packing resin, a protective glass, etc., whereby light is introduced from the opposite side of the substrate. The solar cell module may have a structure where the cells are placed on a substrate of a transparent material such as a tempered glass to introduce light from the transparent substrate side. Specifically, a superstraight type module structure, a substrate type module structure, a potting type module structure, substrate-integrated type module structure that is generally used in amorphous silicon solar cells, etc. are known as the solar cell module structure. The solar cell comprising the photoelectric conversion device of the present invention may have a module structure properly selected from the above structures in accordance with ends and environment at use, and preferably has a module structure disclosed in Japanese Patent Application No. 1-8457, Japanese Patent Laid-Open No. 2000-268892, etc.

EXAMPLES

The present invention will be explained in more detail with reference to examples below without intention of restricting the scope of the present invention.

Example 1

1. Preparation of Coating Dispersion Containing Titanium Dioxide

A titanium dioxide dispersion was prepared in the same manner as a method disclosed in C. J. Barbe, et al, J. Am. Ceramic Soc., 80, 3157 except that the autoclave temperature was 230° C. The weight ratio of titanium dioxide fine particles was 11 weight % and the average diameter thereof was approximately 10 nm in the titanium dioxide dispersion. Then, polyethylene glycol (average molecular weight: 20000, Wako Pure Chemical Industries, Ltd.) was added to the titanium dioxide dispersion and mixed to prepare a coating dispersion containing titanium dioxide, weight ratio of the polyethylene glycol being 20 weight % to 100 weight % of the titanium dioxide fine particles.

2. Preparation of Dye-Adsorbed Titanium Dioxide Electrode (1) Comparative Electrode The above coating dispersion was applied onto an electrically conductive surface of a transparent conductive support into a thickness of 120 μm by a doctor blade, dried at 25° C. for 30 minutes, and baked by an electric furnace "muffle furnace FP-32" manufactured by Yamato Science K. K. at 450° C. for 30 minutes to provide a titanium dioxide electrode having a titanium dioxide layer. Used as the transparent conductive support was a conductive glass manufactured by Nippon Sheet Glass Co., Ltd. having a surface resistance of approximately 10 $\Omega/cm^2$, which was composed of a glass substrate and an electrically conductive layer of fluorine-doped tin oxide. Amount of the titanium dioxide in the resultant titanium dioxide layer was 18 $g/m^2$, and thickness of the titanium dioxide layer was 12 μm.

Thus-obtained titanium dioxide electrode was cooled, and soaked in a dye adsorption solution composed of a ruthenium complex dye R-1 (cis-(dithiocyanate)-N,N'bis(2,2'-bipyridyl-4,4'-dicarboxylic acid) ruthenium (II) complex) and a mixture solvent of ethanol/acetonitrile=1/1 (volume ratio) at an adsorbing temperature of 25° C. for an adsorbing period of 16 hours, to adsorb the dye R-1 on the titanium dioxide electrode. Concentration of the dye R-1 in the dye adsorption solution was $3\times10^{-4}$ mol/l. Then, the resultant electrode was washed with each of ethanol and acetonitrile in this order to prepare Comparative Electrode T-1.

Further, Comparative Electrode T-2 was prepared in the same manner as the Comparative Electrode T-1 except that a ruthenium complex dye R-10 was used instead of the dye R-1.

(2) After-Treatment Electrode

The above-described electrode T-1 was soaked in a treatment liquid A-1 shown in Table 1 at a treatment temperature of 40° C. for a treatment period of 1.5 hours, washed with acetonitrile, and dried in the dark under nitrogen gas stream, to prepare After-Treatment Electrode TA-1.

After-Treatment Electrodes TA-2 to TA-9 were prepared in the same manner as the After-Treatment Electrode TA-1 except that treatment liquids A-2 to A-9 shown in Table 1 were used instead of the treatment liquid A-1, respectively.

Further, After-Treatment Electrodes TA-10 and TA-11 were prepared in the same manner as the After-Treatment Electrodes TA-1 and TA-2 except that the electrode T-2 was used instead of the electrode T-1, respectively.

Incidentally, each of the treatment liquids A-1 to A-9 was composed of a compound (a) and an additive shown in Table 1 and acetonitrile. Concentration of the compound (I) in the treatment liquid was 0.01 mol/l.

TABLE 1

| After-Treatment Electrode | Electrode | Treatment Liquid | Compound (I) | Additive |
|---|---|---|---|---|
| TA-1 | T-1 | A-1 | (I-1) | None |
| TA-2 | T-1 | A-2 | (I-6) | None |
| TA-3 | T-1 | A-3 | (I-6) | t-Butylpyridine (0.1 mol/l) |
| TA-4 | T-1 | A-4 | (I-7) | None |
| TA-5 | T-1 | A-5 | (I-7) | t-Butylpyridine (0.1 mol/l) |
| TA-6 | T-1 | A-6 | (I-5) | None |
| TA-7 | T-1 | A-7 | (I-21) | None |
| TA-8 | T-1 | A-8 | (I-23) | t-Butylpyridine (0.1 mol/l) |
| TA-9 | T-1 | A-9 | (I-9) | t-Butylpyridine (0.1 mol/l) |
| TA-10 | T-2 | A-1 | (I-1) | None |
| TA-11 | T-2 | A-2 | (I-6) | None |

(3) Simultaneous Treatment Electrode

Simultaneous Treatment Electrodes TD-1 to TD-7 were prepared in the same manner as the electrodes T-1 and T-2 except that the treatment liquids D-1 to D-7 shown in Table 2 were used instead of the above-mentioned dye adsorption solution, respectively.

Incidentally, each of the treatment liquids D-1 to D-7 was composed of a compound (I) and a dye shown in Table 2 and a mixture solvent of ethanol/acetonitrile=1/1 (volume ratio). Concentration of the dye was $3\times10^{-4}$ mol/l and concentration of the compound (I) was 0.01 mol/l in each treatment liquid.

TABLE 2

| Simultaneous Treatment Electrode | Treatment Liquid | Compound (I) | Dye |
|---|---|---|---|
| TD-1 | D-1 | (I-1) | R-1 |
| TD-2 | D-2 | (I-3) | R-1 |
| TD-3 | D-3 | (I-6) | R-1 |
| TD-4 | D-4 | (I-9) | R-1 |
| TD-5 | D-5 | (I-22) | R-1 |
| TD-6 | D-6 | (I-1) | R-10 |
| TD-7 | D-7 | (I-6) | R-10 |

(4) Pre-Treatment Electrode

The above coating dispersion was applied onto the transparent conductive support, dried, baked and cooled in the same manner as the method for preparing the electrode T-1. Next, this was soaked in a treatment liquid B-1 shown in Table 3 at a treatment temperature of 40° C. for a treatment period of 1.5 hours, washed with acetonitrile, dried under nitrogen gas stream, and heated at 120° C. for 30 seconds by a hot plate. Then, on this was adsorbed the dye R-1 in the same manner as the method for preparing the electrode T-1, to prepare Pre-Treatment Electrode TB-1.

Further, Pre-Treatment Electrode TB-2 was prepared in the same manner as the Pre-Treatment Electrode TB-1 except that a treatment liquid B-2 shown in Table 3 was used instead of the treatment liquid B-1.

Incidentally, each of the treatment liquids B-1 and B-2 was composed of a compound (I) and an additive shown in Table 3 and acetonitrile. Concentration of the compound (I) in each treatment liquid was 0.01 mol/l.

TABLE 3

| Pre-Treatment Electrode | Treatment Liquid | Compound (I) | Additive | Dye |
|---|---|---|---|---|
| TB-1 | B-1 | (I-1) | None | R-1 |
| TB-2 | B-2 | (I-6) | None | R-1 |

(5) Two Step Treatment Electrode

The above-described Simultaneous Treatment Electrodes TD-1 and TD-7 were soaked in the treatment liquid A-3 and A-2 as shown in Table 4 at a treatment temperature of 40° C. for a treatment period of 1.5 hours, washed with acetonitrile, and dried in the dark under nitrogen gas stream, to prepare Two Step Treatment Electrodes TAD-1 and TAD-2, respectively.

TABLE 4

| Two Step Treatment Electrode | Simultaneous Treatment Electrode | Treatment Liquid | Compound (I) | Additive |
|---|---|---|---|---|
| TAD-1 | TD-1 | A-3 | (I-6) | t-Butylpyridine (0.1 mol/l) |
| TAD-2 | TD-7 | A-2 | (I-6) | None |

3. Production of Photoelectric Conversion Device

Figure 10:
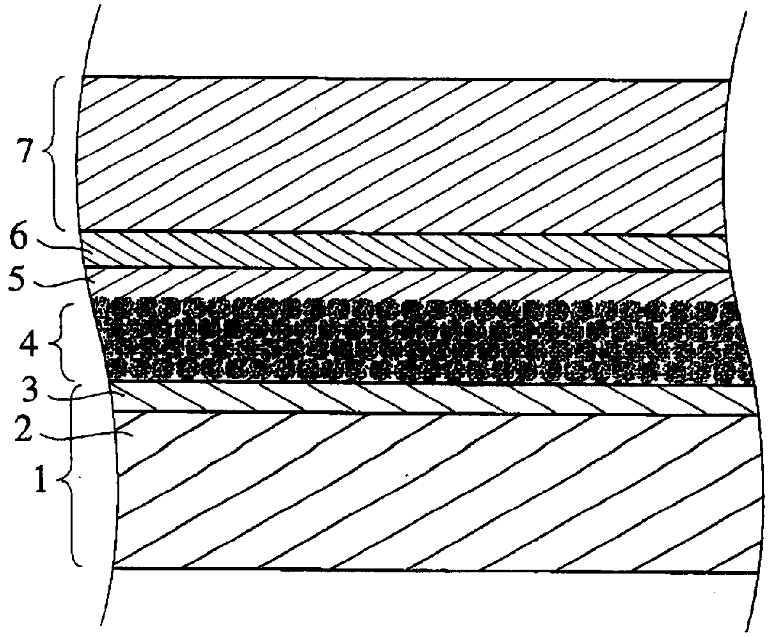
FIG. 10 is a partial cross sectional view showing a structure of the photoelectric conversion device according to the EXAMPLES.

The 2 cm×2 cm in size of the Comparative Electrode T-1 was put on a platinum-deposited glass having the same size thereas. Then, an electrolysis solution composed of 1,3-dimethylimidazolium iodide (0.65 mol/l), iodine (0.05 mol/l) and acetonitrile was permeated into a crevice between the electrode and the platinum-deposited glass through capillarity, to produce a comparative photoelectric conversion device C-1. According to this example, a photoelectric conversion device having a structure shown in FIG. 10, in which a conductive glass 1 composed of a glass 2 and an electrically conductive layer 3, a dye-sensitized $TiO_2$ layer 4, an electrolyte layer 5, a platinum layer 6 and a glass 7 were laminated in this order, was produced.

Photoelectric conversion devices C-2 to C-24 were produced in the same manner as the device C-1 except that the electrodes shown in Table 5 were used instead of the Comparative Electrode T-1, respectively.

4. Measurement of Photoelectric Conversion Efficiency

A silver paste was applied to edge portion of the transparent conductive support of each photoelectric conversion device C-1 to C-24, to form a negative electrode. Then, the negative electrode and the platinum-deposited glass were connected to the current-voltage tester "Keithley SMU238". Each of the resultant photoelectric conversion devices was measured with respect to current-voltage properties while perpendicularly irradiating a simulated sunlight thereto, to obtain the photoelectric conversion efficiency. The results were shown in Table 5. Herein, the simulated sunlight was generated by passing the light of 500 W xenone lamp manufactured by Ushio K.K. through "AM 1.5 filter" manufactured by Oriel Co, and had intensity of 100 mW/cm$^2$.

TABLE 5

| Photoelectric Conversion Device | Electrode | Dye | Compound (I) Pre-Treatment | Compound (I) Simultaneous Treatment | Compound (I) After-Treatment | Photoelectric Conversion Efficiency (%) |
|---|---|---|---|---|---|---|
| C-1 | T-1 | R-1 | — | — | — | 5.3 |
| C-2 | T-2 | R-10 | — | — | — | 5.1 |
| C-3 | TA-1 | R-1 | — | — | (I-1) | 6.4 |
| C-4 | TA-2 | R-1 | — | — | (I-6) | 6.8 |
| C-5 | TA-3 | R-1 | — | — | (I-6)/TBP | 7.2 |
| C-6 | TA-4 | R-1 | — | — | (I-7) | 6.7 |
| C-7 | TA-5 | R-1 | — | — | (I-7)/TBP | 7.1 |
| C-8 | TA-6 | R-1 | — | — | (I-5) | 6.4 |
| C-9 | TA-7 | R-1 | — | — | (I-21) | 6.5 |
| C-10 | TA-8 | R-1 | — | — | (I-23)/TBP | 7.1 |
| C-11 | TA-9 | R-1 | — | — | (I-9)/TBP | 7.1 |
| C-12 | TA-10 | R-10 | — | — | (I-1) | 6.0 |
| C-13 | TA-11 | R-10 | — | — | (I-6) | 6.7 |
| C-14 | TD-1 | R-1 | — | (I-1) | — | 7.0 |
| C-15 | TD-2 | R-1 | — | (I-3) | — | 6.8 |
| C-16 | TD-3 | R-1 | — | (I-6) | — | 6.4 |
| C-17 | TD-4 | R-1 | — | (I-9) | — | 7.0 |
| C-18 | TD-5 | R-1 | — | (I-22) | — | 6.9 |
| C-19 | TD-6 | R-10 | — | (I-1) | — | 5.9 |
| C-20 | TD-7 | R-10 | — | (I-6) | — | 6.8 |
| C-21 | TB-1 | R-1 | (I-1) | — | — | 5.6 |
| C-22 | TB-2 | R-1 | (I-6) | — | — | 5.7 |
| C-23 | TAD-1 | R-1 | — | (I-1) | (I-6)/TBP | 7.3 |
| C-24 | TAD-2 | R-10 | — | (I-6) | (I-6) | 7.1 |

As shown in Table 5, the photoelectric conversion devices C-3 to C-24 of the present invention, in which the semiconductor fine particle was treated with the compound (I), exhibited more excellent photoelectric conversion efficiency than those of the comparative photoelectric conversion devices C-1 and C-2.

As compared with the photoelectric conversion devices C-21 and C-22, the photoelectric conversion devices C-3, C-14, C-4 and C-16 exhibited higher photoelectric conversion efficiency. It was clear from this that the semiconductor fine particle was preferably treated with the compound (I) after or while the dye was adsorbed thereon.

Further, as compared with the photoelectric conversion devices C-5, C-14, C-13 and C-20, the photoelectric conversion devices C-23 and C-24 exhibited higher photoelectric conversion efficiency. As was clear from this, it was preferable that the simultaneous treatment and the after-treatment were continuously carried out in the present invention.

From the results of the photoelectric conversion devices C-21 and C-22, C-3 and C 4or C-5, and C-12 and C-13, it was preferred that the compound (I) had an alkoxysilyl group.

Example 2

Photoelectric conversion devices were produced in the same manner as Example 1 except that a merocyanine dye or a squalilium dye was used instead of the ruthenium complex dye. Incidentally, concentration of the dye in the dye adsorption solution was $1\times10^{-4}$ mol/l. Each of the resultant photoelectric conversion devices was measured with respect to the photoelectric conversion efficiency in the same manner as Example 1. As a result, the photoelectric conversion devices of the present invention, in which the semiconductor fine particle was treated with the compound (I), exhibited more excellent photoelectric conversion efficiency than those of the comparative photoelectric conversion devices.

Example 3

1. Preparation of Coating Dispersion Containing Titanium Dioxide

A coating dispersion containing titanium dioxide was prepared in the same manner as Example 1.

2. Preparation of Dye-Adsorbed Titanium Dioxide Electrode (1) Comparative Electrode Comparative Electrode T-1 was prepared in the same manner as Example 1 using the above coating dispersion.

Further, Comparative Electrode T-1' was prepared in the same manner as the Comparative Electrode T-1 except that to the dye adsorption solution was added the compound (II-1), lithium iodide. Concentration of the compound (II-1) in the dye adsorption solution was 0.01 mol/l.

(2) Treatment Electrode

Electrodes T-3 to T-11 were prepared in the same manner as the Comparative Electrode T-1 except that the semiconductor fine particle was treated with the compound (I) and the compound (II) shown in Table 6, respectively.

TABLE 6

| | Compound (I) and Compound (II) | | |
|---|---|---|---|
| Electrode | Pre-Treatment | Simultaneous Treatment | After-Treatment |
| T-1 | — | — | — |
| T-1' | — | (II-1) | — |
| T-3 | — | (II-1) | (I-6)/TBP |
| T-4 | — | (II-1)/(I-1) | (I-6) |
| T-5 | — | (II-1) | (I-7) |
| T-6 | — | (II-6) | (I-6)/TBP |
| T-7 | (II-1) | — | (I-6)/TBP |
| T-8 | — | (I-1) | (II-22) |
| T-9 | — | (I-1) | (II-18) |
| T-10 | — | (I-1) | (II-1) |
| T-11 | — | — | (II-22)/(I-6)/TBP |

(a) Pre-Treatment

In the production of the electrode T-7, pre-treatment using the compound (II-1) was carried out as follows. The coating dispersion was applied onto the transparent conductive support, dried, baked and cooled in the same manner as the method for preparing the electrode T-1. Next, before the adsorption of the dye R-1, this was soaked in a treatment liquid composed of the compound (II-1) and a mixture solvent of ethanol/acetonitrile=1/1 (volume ratio) at a treatment temperature of 40° C. for a treatment period of 1.5 hours, washed with acetonitrile, dried under nitrogen gas stream, and heated at 120° C. for 30 seconds by a hot plate. Concentration of the compound (II-1) in the treatment liquid was 0.01 mol/l.

(b) Simultaneous Treatment

In the production of the electrodes T-3 to T-6 and T-8 to T-10, simultaneous treatment was carried out by adding the compound (I) and/or the compound (II) to the dye adsorption solution used in the production of the electrode T-1. Incidentally, the dye adsorption solution (treatment liquid) was composed of the compound (I) and/or the compound (II), the dye and a mixture solvent of ethanol/acetonitrile=1/1 (volume ratio). Concentration of the dye was $3\times10^{-4}$ mol/l, and concentration of each of the compound (I) and (II) was 0.01 mol/l in the treatment liquid.

(c) After-Treatment

In the production of the electrodes T-3 to T-11, after-treatment was carried out as follows. The electrode was soaked in a treatment liquid at a treatment temperature of 40° C. for a treatment period of 1.5 hours, washed with acetonitrile, and dried in the dark under nitrogen gas stream after the adsorption of the dye. Incidentally, the treatment liquid was composed of the compound (I) and/or the compound (II) and acetonitrile. Concentration of each of the compounds (I) and (H) in the treatment liquid was 0.01 mol/l, and to the treatment liquid was optionally added t-butylpyridine shown as TBP in Table 6.

3. Production of Photoelectric Conversion Device

To the 2 cm×2 cm in size of the Comparative Electrode T-1 was applied an electrolysis solution composed of 1-ethyl-3-methylimidazolium iodide Y6-1 (0.65 mol/l), 1-ethyl-3-methylimidazolium tetrafluoroborate Y6-2 (0.65 mol/l), iodine (0.05 mol/l) and acetonitrile. The electrolysis solution was made to penetrate into the electrode while distilling off acetonitrile at 60° C. under a reduced pressure. Then, the electrode was put on a platinum-deposited glass having the same size thereas, to produce a comparative photoelectric conversion device C-25. According to this example, a photoelectric conversion device having a structure shown in FIG. 10, in which a conductive glass 1 composed of a glass 2 and an electrically conductive layer 3, a dye-sensitized $TiO_2$ layer 4, an electrolyte layer 5, a platinum layer 6 and a glass 7 were laminated in this order, was produced.

Photoelectric conversion devices C-26 to C-36 were produced in the same manner as the device C-25 except that the electrodes shown in Table 7 were used instead of the Comparative Electrode T-1, respectively.

4. Measurement of Photoelectric Conversion Efficiency

The photoelectric conversion efficiency of each photoelectric conversion device C-25 to C-36 was obtained in the same manner as Example 1. The results were shown in Table 7.

TABLE 7

| Photoelectric Conversion Device | Electrode | Compound (I) and Compound (II) Pre-Treatment | Simultaneous Treatment | After-Treatment | Photoelectric Conversion Efficiency (%) |
|---|---|---|---|---|---|
| C-25 | T-1 | — | — | — | 4.3 |
| C-26 | T-1' | — | (II-1) | — | 4.4 |
| C-27 | TA-3 | — | — | (I-6)/TBP | 5.0 |
| C-28 | T-3 | — | (II-1) | (I-6)/TBP | 6.2 |
| C-29 | T-4 | — | (II-1)/(I-1) | (I-6) | 5.7 |
| C-30 | T-5 | — | (II-1) | (I-7) | 6.0 |
| C-31 | T-6 | — | (II-6) | (I-6)/TBP | 5.9 |
| C-32 | T-7 | (II-1) | — | (I-6)/TBP | 5.6 |
| C-33 | T-8 | — | (I-1) | (II-22) | 6.0 |
| C-34 | T-9 | — | (I-1) | (II-18) | 5.8 |
| C-35 | T-10 | — | (I-1) | (II-1) | 5.1 |
| C-36 | T-11 | — | — | (II-22)/(I-6)/TBP | 5.2 |

As shown in Table 7, the photoelectric conversion devices C-27 to C-36 of the present invention where the semiconductor fine particle was treated with the compounds (I) exhibited more excellent photoelectric conversion efficiency than that of the comparative photoelectric conversion device C-25 where the semiconductor was not treated and that of the comparative photoelectric conversion device C-26 where the semiconductor was treated with only the compound (II).

As compared with the photoelectric conversion device C-27, the photoelectric conversion devices C-28, C-31, C-32 and C-36 exhibited higher photoelectric conversion efficiency. It was thus clear that the semiconductor fine particle was preferably treated with both of the compound (I) and the compound (II).

Example 4

Photoelectric conversion devices were produced in the same manner as Example 3 except that the ruthenium complex dye (R-10), a merocyanine dye or a squalilium dye was used instead of the ruthenium complex dye (R-1). Incidentally, concentration of the dye in the dye adsorption solution was $1\times10^{-4}$ mol/l. Each of the resultant photoelectric conversion devices was measured with respect to the photoelectric conversion efficiency in the same manner as Example 3. As a result, the photoelectric conversion devices of the present invention, in which the semiconductor fine particle was treated with the compounds (I) and (II), exhibited more excellent photoelectric conversion efficiency than those of the comparative photoelectric conversion devices.

Example 5

The 2 cm×2 cm in size of each of the electrodes T-1, T-1', TA-3 and T-3 to T-11 was put on a platinum-deposited glass having the same size thereas. Then, an electrolysis solution composed of 1,3-dimethylimidazolium iodide (0.65 mol/l), iodine (0.05 mol/l) and acetonitrile was permeated into a crevice between the electrode and the platinum-deposited glass through capillarity, to produce photoelectric conversion devices. Each of the resultant photoelectric conversion devices was measured with respect to the photoelectric conversion efficiency in the same manner as Example 3. As a result, the photoelectric conversion devices of the present invention, in which the semiconductor fine particle was treated with the compounds (I) and (II), exhibited more excellent photoelectric conversion efficiency than those of the comparative photoelectric conversion devices.

As described in detail above, a photoelectric conversion device excellent in photoelectric conversion efficiency can be produced by a method of the present invention comprising the step of treating a semiconductor fine particle with a compound (I). The photoelectric conversion efficiency is further improved when the semiconductor fine particle is treated with each of the compound (I) and the compound (II).

What is claimed is:

1. A method for producing a photoelectric conversion device comprising a conductive support and a photosensitive layer containing a semiconductor fine particle on which a dye is adsorbed, wherein said semiconductor fine particle is treated with a compound represented by the following general formula (I):

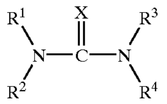

(I)

wherein X represents an oxygen atom, a sulfur atom, a selenium atom or NY, in which Y represents a hydrogen atom, an aliphatic hydrocarbon group, a hydroxyl group or an alkoxy group; $R^1$, $R^2$, $R^3$ and $R^4$ independently represent a hydrogen atom, an aliphatic hydrocarbon group, an aryl group, a heterocyclic group, $—N(R^5)(R^6)$, $—C(=O)R^7$, $—C(=S)R^8$, $—SO_2R^9$ or $—OR^{10}$; $R^5$ and $R^6$ independently have the same meaning as said $R^1$, $R^2$, $R^3$ and $R^4$; $R^7$, $R^8$ and $R^9$ independently represent a hydrogen atom, an aliphatic hydrocarbon group, an aryl group, a heterocyclic group, $—N(R^5)(R^6)$, $—OR^{10}$ or $—SR^{11}$; and $R^{10}$ and $R^{11}$ independently represent a hydrogen atom or an aliphatic hydrocarbon group.

2. The method for producing a photoelectric conversion device according to claim 1, wherein said semiconductor fine particle is treated with a solution comprising said compound represented by the general formula (I).

3. The method for producing a photoelectric conversion device according to claim 1, wherein said semiconductor fine particle is treated with said compound represented by the general formula (I) after said dye is adsorbed on said semiconductor fine particle.

4. The method for producing a photoelectric conversion device according to claim 3, wherein said semiconductor fine particle is treated with a compound having a basic group while said semiconductor fine particle is treated with said compound represented by the general formula (I).

5. The method for producing a photoelectric conversion device according to claim 4, wherein said compound having a basic group is pyridine or a derivative thereof.

6. The method for producing a photoelectric conversion device according to claim 1, wherein said semiconductor fine particle is treated with said compound represented by the general formula (I) while said dye is adsorbed on said semiconductor fine particle.

7. The method for producing a photoelectric conversion device according to claim 1, wherein said semiconductor fine particle is treated with said compound represented by the general formula (I) and a compound represented by the following general formula (II):

$$M_p.Z_q \qquad (II)$$

wherein M represents an alkali metal ion, an alkaline earth metal ion, an ammonium ion, an imidazolium ion or a pyridinium ion; Z represents a halide ion, a carboxylate ion, a sulfonate ion, a phosphonate ion, a bis-sulfonylimide ion, a tris-sulfonylmethide ion, a sulfate ion, a thiocyanate ion, a cyanate ion, a perchlorate ion, a tetrafluoroborate ion or a hexafluorophosphate ion; and p and q independently represent an integer of 1 or more.

8. The method for producing a photoelectric conversion device according to claim 7, wherein said semiconductor fine particle is treated with a solution comprising said compound represented by the general formula (I) and a solution comprising said compound represented by the general formula (II), or with a solution comprising said compound represented by the general formula (I) and said compound represented by the general formula (II).

9. The method for producing a photoelectric conversion device according to claim 7, wherein said semiconductor fine particle is treated with said compound represented by the general formula (I) after said dye is adsorbed on said semiconductor fine particle, and said semiconductor fine particle is treated with a compound having a basic group while said semiconductor fine particle is treated with said compound represented by the general formula (I).

10. The method for producing a photoelectric conversion device according to claim 9, wherein said compound having a basic group is pyridine or a derivative thereof.

11. The method for producing a photoelectric conversion device according to claim 7, wherein said semiconductor fine particle is treated with said compound represented by the general formula (I) while said dye is adsorbed on said semiconductor fine particle, and said semiconductor fine particle is then treated with said compound represented by the general formula (II).

12. The method for producing a photoelectric conversion device according to claim 7, wherein said semiconductor fine particle is treated with said compound represented by the general formula (II) while said dye is adsorbed on said semiconductor fine particle, and said semiconductor fine particle is then treated with said compound represented by the general formula (I).

13. The method for producing a photoelectric conversion device according to claim 1, wherein said X is an oxygen atom.

14. The method for producing a photoelectric conversion device according to claim 1, wherein at least one of X, $R^1$, $R^2$, $R^3$ or $R^4$ of said compound represented by the general formula (I) has a substituent $-Si(R^{12})(R^{13})(R^{14})$, in which $R^{12}$, $R^{13}$ and $R^{14}$ independently represent a hydroxyl group, an alkoxy group, a halogen atom, an isocyanate group or an aliphatic hydrocarbon group, at least one of $R^{12}$, $R^{13}$ and $R^{14}$ being an alkoxy group, a halogen atom or an isocyanate group.

15. The method for producing a photoelectric conversion device according to claim 1, wherein said dye is a ruthenium complex dye.

16. A photoelectric conversion device obtained by the method recited in claim 1, wherein the device comprises a charge transfer layer containing the compound represented by general formula (I).

17. A photoelectric cell comprising the photoelectric conversion device recited in claim 16.

18. A photoelectric conversion device comprising a conductive support and a photosensitive layer containing a semiconductor fine particle of $TiO_2$ or $Nb_2O_5$ on which a dye is adsorbed, wherein the photosensitive layer includes a compound represented by the following general formula (I):

(I)

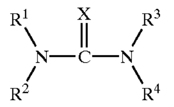

wherein X represents an oxygen atom, a sulfur atom, a selenium atom or NY, in which Y represents a hydrogen atom, an aliphatic hydrocarbon group, a hydroxyl group or an alkoxy group; $R^1$, $R^2$, $R^3$ and $R^4$ independently represent a hydrogen atom, an aliphatic hydrocarbon group, an aryl group, a heterocyclic group, $-N(R^5)(R^6)$, $-C(=O)R^7$, $-C(=S)R^8$, $-SO_2R^9$ or $-OR^{10}$; $R^5$ and $R^6$ independently have the same meaning as said $R^1$, $R^2$, $R^3$ and $R^4$; $R^7$, $R^8$ and $R^9$ independently represent a hydrogen atom, an aliphatic hydrocarbon group, an aryl group, a heterocyclic group, $-N(R^5)(R^6)$, $-OR^{10}$ or $-SR^{11}$; and $R^{10}$ and $R^{11}$ independently represent a hydrogen atom or an aliphatic hydrocarbon group.

19. A photoelectric cell comprising the photoelectric conversion device recited in claim 18.

* * * * *